US012777829B2

(12) United States Patent
Bae et al.

(10) Patent No.: US 12,777,829 B2
(45) Date of Patent: Oct. 27, 2026

(54) DISPLAY DEVICE WITH LIGHT SENSORS IN THE DISPLAY AREA

(71) Applicant: Samsung Display Co., LTD., Yongin-si (KR)

(72) Inventors: Kwang Soo Bae, Yongin-si (KR); Hyeon Sik Kim, Yongin-si (KR); Jung Woo Park, Yongin-si (KR); Tae Kyung Ahn, Yongin-si (KR); Dae Young Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 1009 days.

(21) Appl. No.: 17/880,632

(22) Filed: Aug. 3, 2022

(65) Prior Publication Data

US 2023/0114014 A1 Apr. 13, 2023

(30) Foreign Application Priority Data

Oct. 7, 2021 (KR) ........................ 10-2021-0133435

(51) Int. Cl.
*H01L 27/28* (2006.01)
*H01L 27/32* (2006.01)
(Continued)

(52) U.S. Cl.
CPC ............. *H10K 65/00* (2023.02); *H10K 30/80* (2023.02); *H10K 50/865* (2023.02); (Continued)

(58) Field of Classification Search
CPC ....................................................... H10K 65/00
See application file for complete search history.

(56) References Cited

U.S. PATENT DOCUMENTS 7,057,337 B1 * 6/2006 Guenther ............... H10K 71/60 313/506
8,492,728 B2 7/2013 Antonnuk
(Continued)

FOREIGN PATENT DOCUMENTS

CN 210245499 4/2020
KR 10-2013-0033278 A 4/2013
(Continued)

OTHER PUBLICATIONS

Extended European Search Report was issued from the European Patent Office on Feb. 17, 2023 with respect to the European Patent Application No. 22199606.9 filed on Oct. 4, 2022.

*Primary Examiner* — Peter Bradford
(74) *Attorney, Agent, or Firm* — Womble Bond Dickinson (US) LLP

(57) ABSTRACT

A display device includes a substrate, and unit pixels provided in the substrate, and including sub-pixels each having a light-emitting element emitting light, and photo-sensing pixels each having a light-receiving element outputting a sensing signal corresponding to the light. Each of the sub-pixels may include an emission area emitting the light, and each of the photo-sensing pixels may include a light-receiving area receiving the light. The emission area and the light-receiving area may be provided in the substrate to be spaced apart from each other. Each of the emission area and the light-receiving area may have a shape of a quadrangular plane.

20 Claims, 18 Drawing Sheets

(51) Int. Cl.

| | |
|---|---|
| ***H01L 51/52*** | (2006.01) |
| ***H10K 30/80*** | (2023.01) |
| ***H10K 50/86*** | (2023.01) |
| ***H10K 59/122*** | (2023.01) |
| ***H10K 59/35*** | (2023.01) |
| ***H10K 65/00*** | (2023.01) |
| ***H10K 71/00*** | (2023.01) |
| *G06F 3/044* | (2006.01) |
| *G06V 40/13* | (2022.01) |

(52) U.S. Cl.
CPC ......... *H10K 59/122* (2023.02); *H10K 59/353* (2023.02); *H10K 71/00* (2023.02); *G06F 3/0445* (2019.05); *G06V 40/1318* (2022.01)

(56) References Cited

U.S. PATENT DOCUMENTS

| | | | | |
|---|---|---|---|---|
| 9,167,994 | B2 | 10/2015 | Akiyama | |
| 11,538,868 | B2 | 12/2022 | Seo et al. | |
| 11,543,904 | B2 | 1/2023 | Bok et al. | |
| 2012/0092238 | A1* | 4/2012 | Hwang ................ | G09G 3/3225 345/55 |
| 2016/0225834 | A1* | 8/2016 | Kim ..................... | H10K 59/122 |
| 2018/0247984 | A1* | 8/2018 | Wang ................... | H10K 59/353 |
| 2020/0319731 | A1* | 10/2020 | Yeke Yazdandoost ...................... | H10F 77/1662 |
| 2021/0200366 | A1* | 7/2021 | Bok ....................... | G06V 10/17 |
| 2021/0217817 | A1 | 7/2021 | Seo et al. | |
| 2023/0221811 | A1* | 7/2023 | Watanabe .............. | H10K 59/90 345/179 |
| 2023/0309364 | A1* | 9/2023 | Yamazaki .............. | H05B 33/04 |

FOREIGN PATENT DOCUMENTS

| | | | |
|---|---|---|---|
| KR | 10-2021-0086907 | A | 7/2021 |
| KR | 10-2021-0090754 | A | 7/2021 |

* cited by examiner

LD: AE, EML, CE
OPD: E1, OPL, E2

LD: AE, EML, CE
OPD: E1, OPL, E2

LD: AE, EML, CE
OPD: E1, OPL, E2

LD: AE, EML, CE
OPD: E1, OPL, E2

LD: AE, EML, CE
OPD: E1, OPL, E2

DISPLAY DEVICE WITH LIGHT SENSORS IN THE DISPLAY AREA

CROSS-REFERENCE TO RELATED APPLICATION

The application claims priority from and the benefit of Korean patent application number 10-2021-0133435, filed on Oct. 7, 2021, which is incorporated by reference for all purposes as if fully set forth herein.

BACKGROUND

Field

Embodiments of the invention relate generally to a display device.

Discussion of the Background

Recently, as interest in information display is increasing, research and development of display devices are continuously being made.

The above information disclosed in this Background section is only for understanding of the background of the inventive concepts, and, therefore, it may contain information that does not constitute prior art.

SUMMARY

Devices constructed according to illustrative implementations of the invention are capable of allowing an external input to the device, such as a user's fingerprint applied to the device, to be precisely detected.

Inventive concepts consistent with various embodiments described hereinbelow are directed to a display device, which secures the sectional area of a photo-sensing pixel according to the resolution of a display device (or display panel) by changing the shape of an emission area of a sub-pixel and the shape of a light-receiving area of a light sensing pixel, thus allowing external input to be precisely detected.

Additional features of the inventive concepts will be set forth in the description that follows, and in part will be apparent from the description, or may be learned by practice of the inventive concepts.

An embodiment may provide for a display device. The display device may include a substrate; and a plurality of unit pixels provided in the substrate, and that includes a plurality of sub-pixels each having a light-emitting element that emits light, and a plurality of photo-sensing pixels each having a light-receiving element that outputs a sensing signal corresponding to the light. Each of the plurality of sub-pixels may include an emission area that emits the light, and each of the plurality of photo-sensing pixels may include a light-receiving area that receives the light. The emission area and the light-receiving area may be provided in the substrate to be spaced apart from each other. Each of the emission area and the light-receiving area may have a shape of a quadrangular plane.

The emission area may have a shape of a rectangular plane, and the light-receiving area may have a shape of a square plane.

The emission area of each of the sub-pixels may be spaced apart from the emission area of an adjacent sub-pixel. Each of a distance between the emission areas and a distance between the emission area and the light-receiving area may be 16.5 μm or more.

One of the unit pixels may include one first sub-pixel positioned in a first column of the substrate; a first pair of second sub-pixels positioned in a second column adjacent to the first column in a first direction; one third sub-pixel positioned in a third column adjacent to the second column in the first direction; a second pair of second sub-pixels positioned in a fourth column adjacent to the third column in the first direction; two first photo-sensing pixels positioned in the first column; and two second photo-sensing pixels positioned in the third column.

The first pair of second sub-pixels and the second pair of second sub-pixels may emit light of an identical color.

The first pair of second sub-pixels and the second pair of second sub-pixels may emit green light. Either of the one first sub-pixel and the one third sub-pixel may emit red light, and a remaining one may emit blue light.

The one unit pixel and an adjacent unit pixel positioned in a column identical to a column of the one unit pixel in a second direction intersecting the first direction may share the two first photo-sensing pixels or the two second photo-sensing pixels.

In the first column, the two first photo-sensing pixels may face each other with the one first sub-pixel interposed therebetween. In the third column, the two second photo-sensing pixels may face each other with the one third sub-pixel interposed therebetween.

The one first sub-pixel and the one third sub-pixel may be positioned in an identical row. A distance between the one first sub-pixel and the one third sub-pixel in the row may be different from a distance between the one first sub-pixel and the first photo-sensing pixel in the first column.

Each of the one first sub-pixel, the first pair of second sub-pixels, the second pair of second sub-pixels, and the one third sub-pixel may include an emission area having a shape of a rectangular plane. Each of the first and second photo-sensing pixels may include a light-receiving area having a shape of a square plane.

Each of the one first sub-pixel and the one third sub-pixel may include an emission area having a shape of a rectangular plane. Each of the first pair of second sub-pixels and the second pair of second sub-pixels may include a emission area having a shape of a square plane. Each of the first and second photo-sensing pixels may include a light-receiving area having a shape of a square plane.

The light-emitting element may include an anode electrode, a emission layer positioned on the anode electrode, and a cathode electrode positioned on the emission layer. The light-receiving element may include a first electrode, a light-receiving layer positioned on the first electrode, and a second electrode positioned on the light-receiving layer.

The cathode electrode of the light-emitting element and the second electrode of the light-receiving element may be integrally provided to be electrically connected to each other.

The display device may further include a pixel defining layer positioned on the anode electrode of the light-emitting element and the first electrode of the light-receiving element, and including a first opening exposing a portion of the anode electrode and a second opening exposing a portion of the first electrode; and a thin-film encapsulation layer positioned on the cathode electrode of the light-emitting element and the second electrode of the light-receiving element, and covering the light-emitting element and the light-receiving element.

The first opening may correspond to the emission area, and the second opening may correspond to the light-receiving area.

The display device may further include a first color filter positioned on the thin-film encapsulation layer of the emission area; a second color filter positioned on the thin-film encapsulation layer of the light-receiving area; and a light blocking pattern positioned between the first color filter and the second color filter.

The thin-film encapsulation layer may include an opening exposing a portion of each of the cathode electrode of the light-emitting element and the second electrode of the light-receiving element between the emission area and the light-receiving area. The light blocking pattern may be provided to fill the opening in an area between the emission area and the light-receiving area.

The thin-film encapsulation layer may include an opening exposing a portion of each of the cathode electrode of the light-emitting element and the second electrode of the light-receiving element between the emission area and the light-receiving area. An air layer may be provided in the opening.

The display device may further include a touch sensor positioned between the thin-film encapsulation layer and the first and second color filters.

Another embodiment provides for a display device that includes a substrate; a sub-pixel that includes a pixel circuit that includes at least one transistor provided on the substrate, and a light-emitting element electrically connected to the pixel circuit; and a photo-sensing pixel that includes a sensor circuit that includes at least one sensor transistor provided on the substrate, and a light-receiving element electrically connected to the sensor circuit. The sub-pixel may include an emission area that emits light from the light-emitting element. The photo-sensing pixel may include a light-receiving area that receives the light. The emission area and the light-receiving area may be provided in the substrate to be spaced apart from each other. The emission area may have a shape of a rectangular plane, and the light-receiving area may have a shape of a square plane.

It is to be understood that both the foregoing general description and the following detailed description are illustrative and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate illustrative embodiments of the invention, and together with the description serve to explain the inventive concepts.

DETAILED DESCRIPTION

Figure 1:
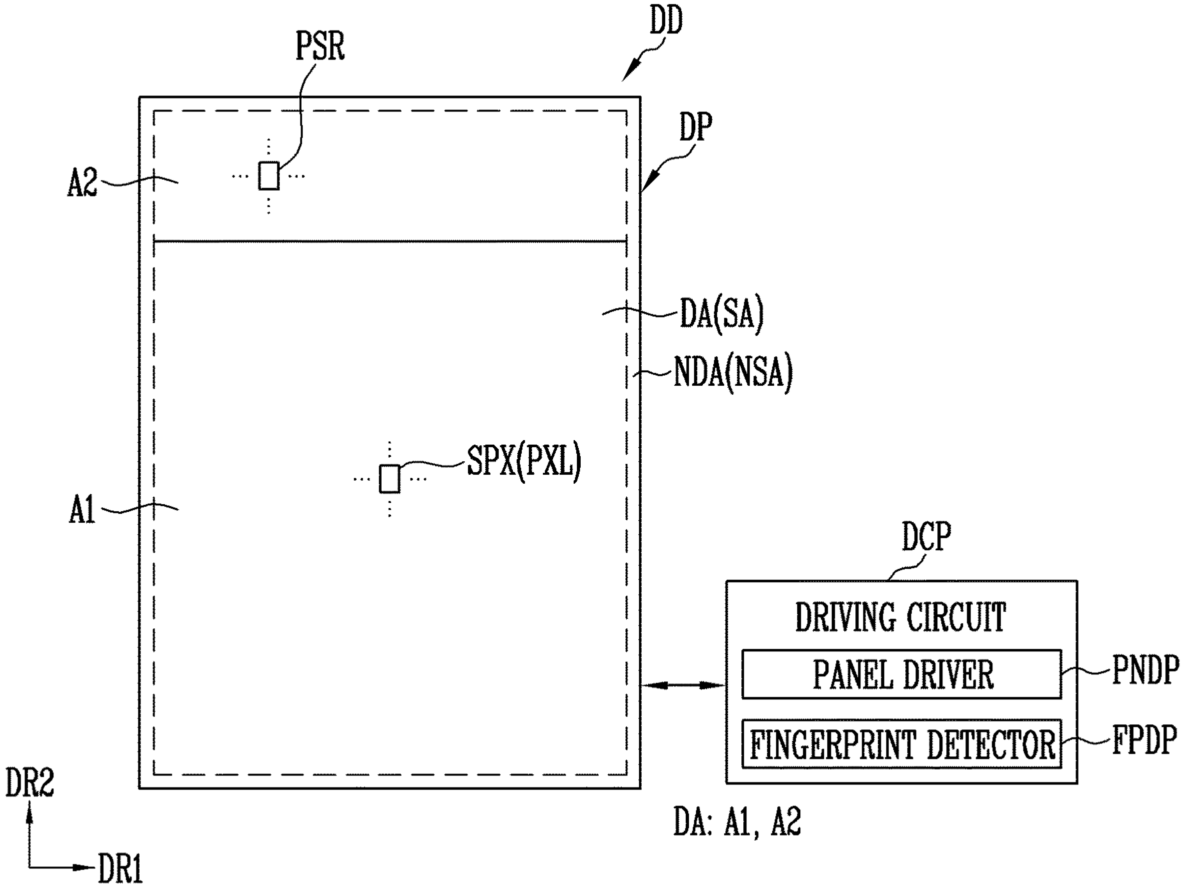
FIGS. 1 and 2 are plan views schematically illustrating a display device in accordance with an embodiment that is constructed according to principles of the invention.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing illustrative features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the DR1-axis, the DR2-axis, and the DR3-axis are not limited to three axes of a rectangular coordinate system, such as the x, y, and z-axes, and may be interpreted in a broader sense. For example, the DR1-axis, the DR2-axis, and the DR3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As customary in the field, some embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some embodiments may be physically separated into two or more interacting and discrete blocks, units, and/or modules without departing from the scope of the inventive concepts. Further, the blocks, units, and/or modules of some embodiments may be physically combined into more complex blocks, units, and/or modules without departing from the scope of the inventive concepts.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 2:
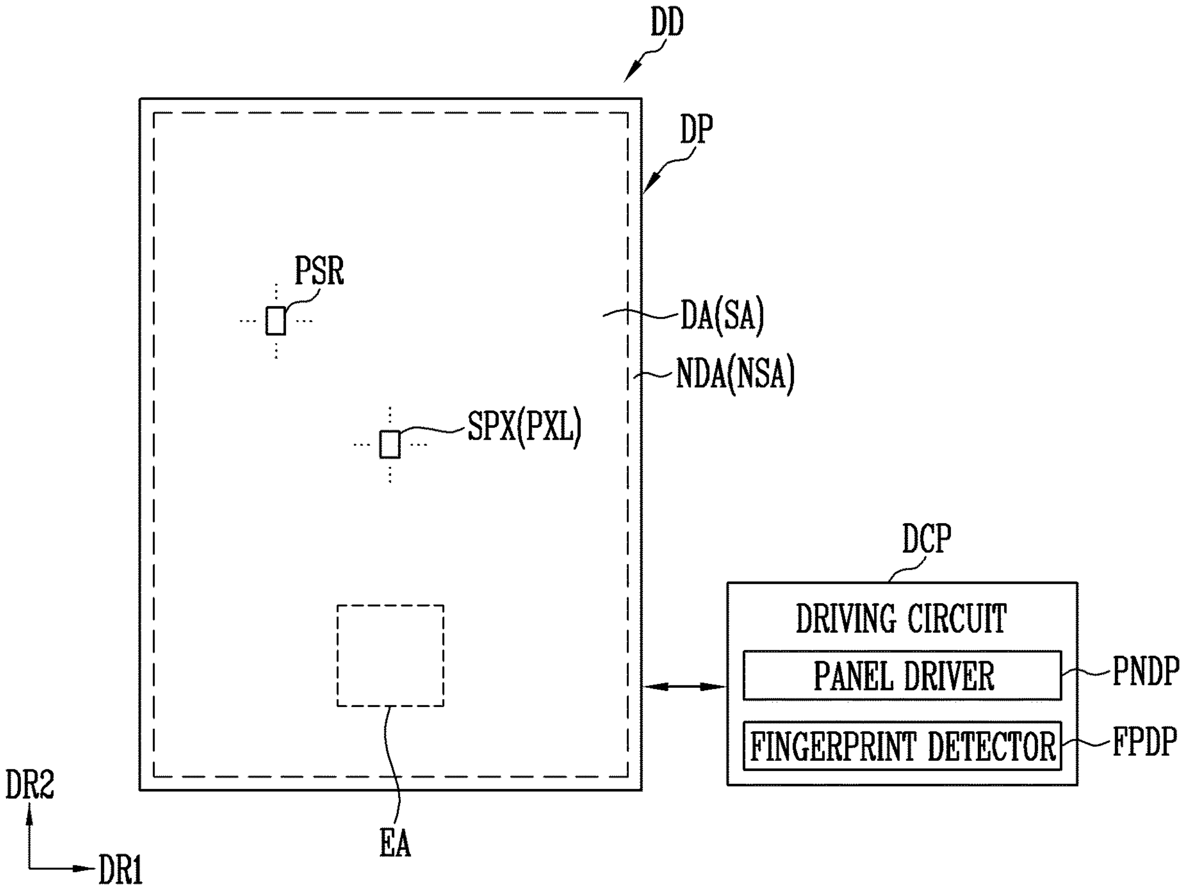

FIGS. 1 and 2 are plan views schematically illustrating a display device DD in accordance with an embodiment that is constructed according to principles of the invention. For instance, FIGS. 1 and 2 are plan views schematically illustrating a display panel DP and a driving circuit DCP for driving the display panel DP, which are provided in the display device DD in accordance with an embodiment.

For the sake of explanation, although the display panel DP and the driving circuit DCP are separately illustrated in FIGS. 1 and 2, the embodiment described herein is not limited thereto. According to an embodiment, the entirety or portion of the driving circuit DCP may be integrally formed on the display panel DP.

Referring to FIGS. 1 to 2, the display device DD may include the display panel DP and the driving circuit DCP.

The display device DD may be provided in various forms, for example, in the form of a rectangular plate having two pairs of parallel sides. However, the embodiment described herein is not limited thereto. In the case where the display device DD is provided in the form of a rectangular plate, one pair of sides of the two pairs of sides may be longer than the other. In an embodiment, for the sake of explanation, there is illustrated an example in which the display device DD has a rectangular form with a pair of long sides and a pair of short sides. In an embodiment, the direction in which the long sides extend is referred to as a second direction DR2, and the direction in which the short sides extend is referred to as a first direction DR1. In an embodiment, in the display device DD provided in the shape of a rectangular plate, a corner portion where one long side and one short side meets may have a round shape.

In an embodiment, the display device DD may have flexibility on at least a portion thereof, and may be folded on the portion having the flexibility.

The display device DD may be a flat display device, a flexible display device, a curved display device, a foldable display device, or a bendable display device. Furthermore, the display device DD may be applied to a transparent display device, a head-mounted display device, a wearable display device, etc.

The display panel DP may include a display area DA and a non-display area NDA. Sub-pixels SPX (or pixels PXL) may be provided in the display area DA to display an image, and the non-display area NDA may be positioned at at least a side of the display area DA. For instance, the non-display area NDA may be provided to enclose the display area DA.

The display area DA may be provided with a plurality of sub-pixels SPX. In an embodiment, each of the sub-pixels SPX may include at least one light-emitting element. In an embodiment, the light-emitting element may be a light-emitting unit including an organic light emitting diode, or subminiature inorganic light emitting diodes each having a size of a microscale to nanoscale range, but the present disclosure is not limited thereto. The display device DD may drive the sub-pixels SPX in response to image data that is input thereto, thus displaying an image in the display area DA.

The non-display area NDA may be an area enclosing at least a side of the display area DA, and be a remaining area except the display area DA. In an embodiment, the non-display area NDA may include a line area, a pad area, and/or various dummy areas.

In an embodiment, an area of the display area DA may be set to a sensing area SA that may sense the fingerprint or the like of a user. In other words, at least a portion of the display area DA may be a sensing area SA. The sensing area SA may include at least some of the sub-pixels SPX provided in the display area DA.

In an embodiment, only a portion of the display area DA may be set to the sensing area SA. In an embodiment, the entirety of the display area DA may be set to the sensing area SA. When the entirety of the display area DA is set to the sensing area SA, the non-display area NDA enclosing the display area DA may be the non-sensing area NSA. In the sensing area SA, a plurality of photo-sensing pixels PSR (or photo sensors) along with a plurality of sub-pixels SPX may be disposed.

Each of the photo-sensing pixels PSR may include a light-receiving element including a light-receiving layer. The light-receiving layer of the light-receiving element may be disposed in the display area DA to be spaced apart from the light-emitting layer of the light-emitting element.

In an embodiment, the plurality of photo-sensing pixels PSR may be distributed to be spaced apart from each other over the entire area of the display area DA. However, the embodiment described herein is not limited thereto. When the display area DA is divided into a first area A1 and a second area A2 in the second direction DR2 as illustrated in FIG. 1, the photo-sensing pixels PSR may be disposed in only the second area A2. According to an embodiment, the photo-sensing pixels PSR may also be disposed in at least a portion of the non-display area NDA.

In an embodiment, the photo-sensing pixels PSR may detect that light emitted from a light source (e.g. a light-emitting element) is reflected by an external object (e.g. a user's finger, etc.). For example, a user's fingerprint may be detected through each of the photo-sensing pixels PSR. Hereinafter, an embodiment where the photo-sensing pixels PSR are used for sensing the fingerprint is described. However, in various embodiments, the photo-sensing pixels PSR may sense various pieces of biometric information such as an iris and a vein. Furthermore, the photo-sensing pixels PSR may sense external light, and may perform functions such as a gesture sensor, a motion sensor, a proximity sensor, an illuminance sensor, and an image sensor.

The driving circuit DCP may drive the display panel DP. For example, the driving circuit DCP may output a data signal corresponding to image data to the display panel DP, or may output driving signals for the photo-sensing pixels PSR and receive electric signals (e.g. sensing signals) from the photo-sensing pixels PSR. The driving circuit DCP may detect the user's fingerprint shape using the electrical signals.

According to an embodiment, the driving circuit DCP may include a panel driver PNDP and a fingerprint detector FPDP (or a sensor driver). For the sake of explanation, although the panel driver PNDP and the fingerprint detector FPDP are separately illustrated in FIGS. 1 and 2, the present disclosure is not limited thereto. For instance, at least a portion of the fingerprint detector FPDP may be integrated with the panel driver PNDP or be operated in conjunction with the panel driver PNDP.

The panel driver PNDP may supply a data signal corresponding to an image data signal to the sub-pixels SPX while sequentially scanning the sub-pixels SPX of the display area DA. In this case, the display panel DP may display an image corresponding to the image data.

According to an embodiment, the panel driver PNDP may supply the driving signal for sensing the fingerprint to the sub-pixels SPX. Such a driving signal may be provided to cause the sub-pixels SPX to emit light and thereby operate as the light source for the photo-sensing pixels PSR. In an embodiment, the panel driver PNDP may also supply the driving signal and/or another driving signal for sensing the fingerprint to the photo-sensing pixels PSR. However, the embodiment described herein is not limited thereto, and driving signals for sensing the fingerprint may be provided by the fingerprint detector FPDP.

The fingerprint detector FPDP may detect biometric information such as a user's fingerprint based on a sensing signal received from the photo-sensing pixels PSR. In an embodiment, the fingerprint detector FPDP may supply the driving signals to the photo-sensing pixels PSR and/or the sub-pixels SPX.

Figure 3:
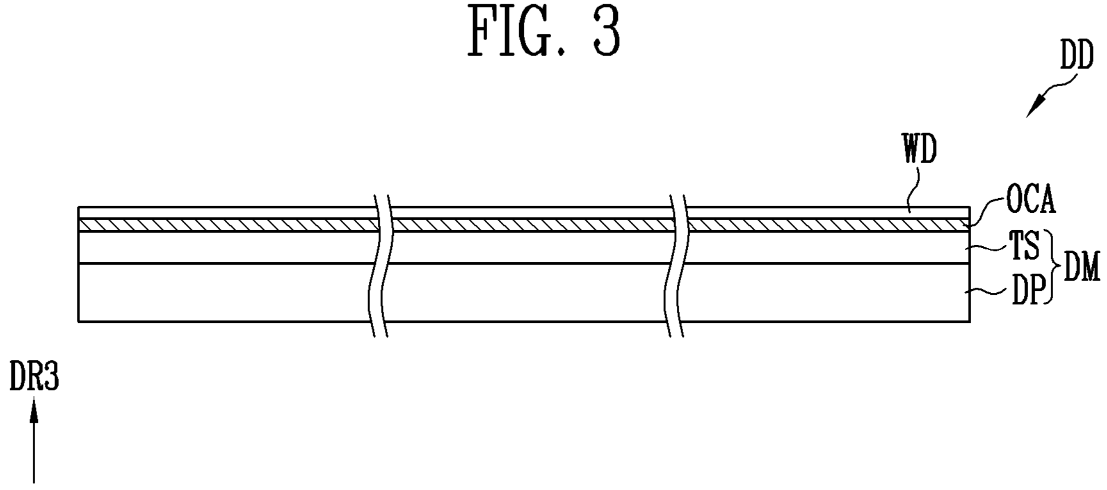
FIG. 3 is a schematic cross-sectional view illustrating the display device in accordance with an embodiment.

FIG. 3 is a schematic cross-sectional view illustrating the display device DD in accordance with an embodiment.

In FIG. 3, the thickness direction of the display device DD is indicated as a third direction DR3 for the sake of explanation.

Referring to FIG. 3, the display device DD may include a display module DM and a window WD.

The display module DM may include a display panel DP and a touch sensor TS.

The touch sensor TS may be disposed directly on the display panel DP, or may be disposed on the display panel DP with a separate layer such as an adhesive layer or a substrate (or insulating layer) interposed therebetween.

The display panel DP may display an image. A self-emissive display panel such as an organic light emitting display panel (OLED panel) may be used as the display panel DP. In addition, a non-emissive display panel such as a liquid crystal display (LCD) panel, an electrophoretic display (EPD) panel, or an electrowetting display (EWD) panel may be used as the display panel DP. In the case where the non-emissive display panel is used as the display panel DP, the display device DD may include a backlight unit configured to supply light to the display panel DP.

The touch sensor TS may be disposed on an image display surface of the display panel DP and configured to receive a touch input of the user. The touch sensor TS may recognize a touch event of the display device DD through the hand of the user or a separate input unit. The touch sensor TS may recognize a touch event in a capacitive manner.

The touch sensor TS may sense the touch input in a mutual capacitance method, or sense the touch input in a self-capacitance method.

The window WD may be provided on the display module DM to protect an exposed surface of the display module DM. The window WD may protect the display module DM from external impact, and provide an input surface and/or a display surface to the user. The window WD may be coupled with the display module DM using an optical transparent adhesive member OCA.

The window WD may have a multilayer structure including at least one selected from among a glass substrate, a plastic film, and a plastic substrate. The multilayer structure may be formed through a continuous process or an adhesion process using an adhesive layer. The window WD may entirely or partially have flexibility.

Figure 4:
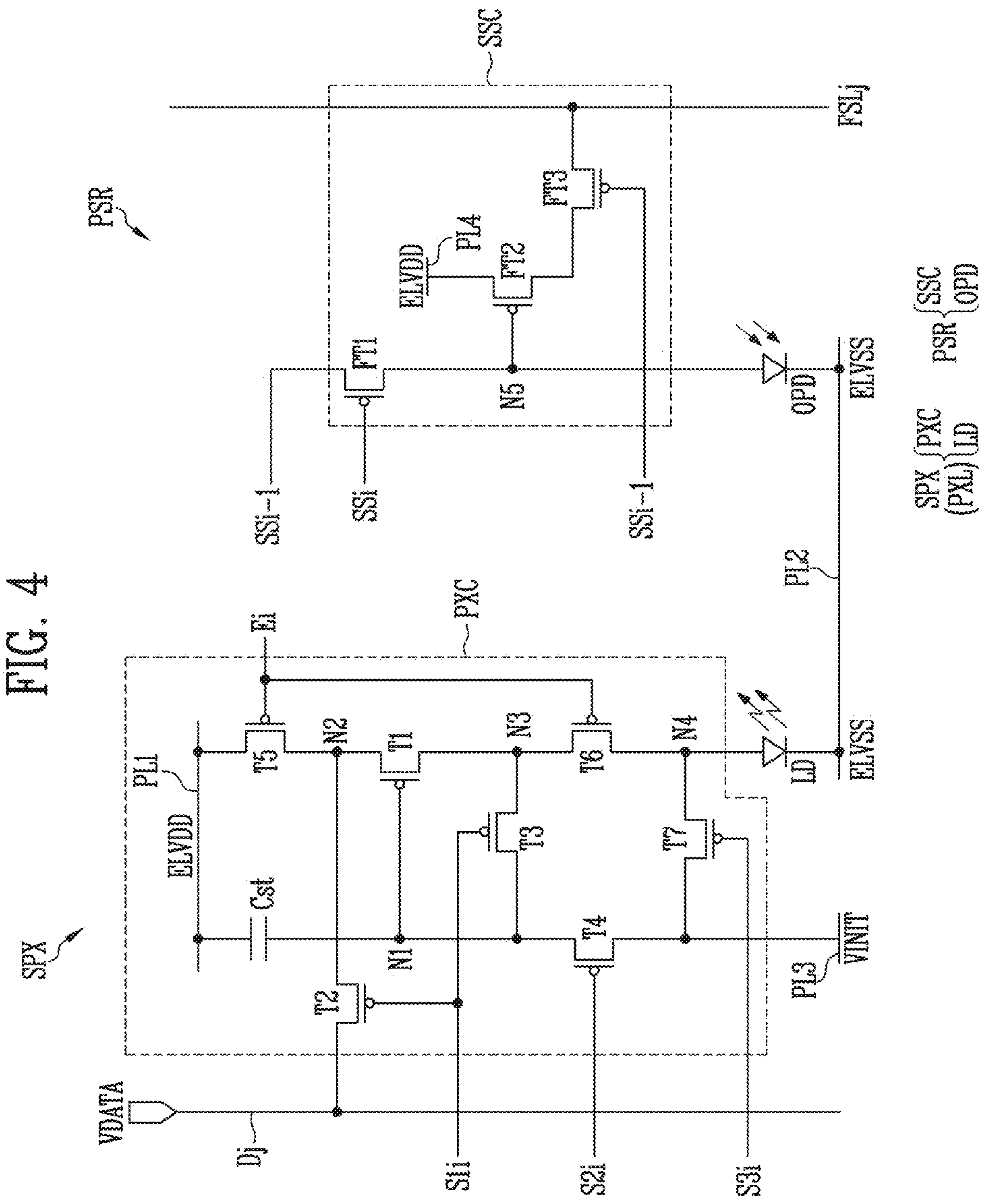
FIG. 4 is a schematic circuit diagram illustrating an example of a sub-pixel and a photo-sensing pixel included in the display device of FIG. 2.

FIG. 4 is a schematic circuit diagram illustrating an example of a sub-pixel SPX and a photo-sensing pixel PSR included in the display device DD of FIG. 2.

For the sake of description, FIG. 4 illustrates a sub-pixel SPX (or pixel PXL) positioned in an i-th pixel row (or i-th horizontal line) and electrically connected to a j-th data line Dj and a photo-sensing pixel PSR positioned in the i-th pixel row and electrically connected to a j-th fingerprint sensing line FSLj (or readout line), where i and j are positive integers greater than or equal to one.

Referring to FIGS. 1 to 4, the sub-pixel SPX may include the pixel circuit PXC and the light-emitting element LD electrically connected thererto, and the photo-sensing pixel PSR may include a sensor circuit SSC and a light-receiving element OPD electrically connected thereto.

A first electrode (or anode electrode) of the light-emitting element LD may be electrically connected to a fourth node N4, and a second electrode (or cathode electrode) thereof may be electrically connected to a second driving power source ELVSS. The light-emitting element LD may emit light having a predetermined luminance corresponding to the amount of current (driving current) supplied from the first transistor T1.

In an embodiment, the light-emitting element LD may be an organic light emitting diode including an organic light-emitting layer. According to an embodiment, the light-emitting element LD may be an inorganic light-emitting element formed of an inorganic material or a light-emitting element formed of a composite of an inorganic material and an organic material.

In an embodiment, the light-receiving element OPD may be an organic photodiode. A first electrode (or first sensor electrode) of the light-receiving element OPD may be electrically connected to a fifth node N5, and a second electrode (or second sensor electrode) thereof may be electrically connected to the second driving power source ELVSS. The light-receiving element OPD may generate a carrier including free electrons and holes based on the intensity of light incident on the light-receiving layer, and may generate a current (photocurrent) by the movement of the carrier.

The pixel circuit PXC may include a first transistor T1, a second transistor T2, and a storage capacitor Cst. In an embodiment, the pixel circuit PXC may include third to seventh transistors T3 to T7.

A gate electrode of the first transistor (or driving transistor) T1 may be electrically connected to a first node N1, a first electrode of the first transistor T1 may be electrically connected to a second node N2, and a second electrode of the first transistor T1 may be electrically connected to a third node N3.

The first transistor T1 may control, in response to a voltage of the first node N1, current flowing from the first driving power source ELVDD to the second driving power source ELVSS via the light-emitting element LD. To this end, the voltage of the first driving power source ELVDD may be set to a value higher than that of the second driving power source ELVSS.

The second transistor T2 (or switching transistor) may be electrically connected between the j-th data line Dj (hereinafter referred to as a 'data line') electrically connected to the pixel PXL and the second node N2. A gate electrode of the second transistor T2 may be electrically connected to a first scan line S1*i* electrically connected to the pixel PXL. When a scan signal is supplied to the first scan line S1*i*, the second transistor T2 may be turned on to electrically connect the data line Dj and the second node N2.

The third transistor T3 (or compensation transistor) may be electrically connected between the second electrode (i.e. the third node N3) and the gate electrode (i.e. the first node N1) of the first transistor T1. A gate electrode of the third transistor T3 may be electrically connected to the first scan line S1*i*. When the scan signal is supplied to the first scan line S1*i*, the third transistor T3 may be turned on to electrically connect the second electrode and the gate electrode (or the first node N1 and the third node N3) of the first transistor T1. In other words, timing at which the second electrode of the first transistor T1 and the gate electrode of the first transistor T1 are electrically connected may be controlled by the scan signal. When the third transistor T3 is turned on, the first transistor T1 may be electrically connected in the form of a diode.

The fourth transistor T4 (or first initialization transistor) may be electrically connected between the first node N1 (or the gate electrode of the first transistor T1) and a third power line PL3 to which initialization voltage VINT is applied. A gate electrode of the fourth transistor T4 may be electrically connected to a second scan line S2*i*. The fourth transistor T4 may be turned on in response to the scan signal supplied to the second scan line S2*i* to supply the initialization voltage VINIT to the first node N1. Here, the initialization voltage VINIT may be set to a voltage lower than the data voltage VDATA supplied to the data line Dj. Thus, the gate voltage (or the first node N1) of the first transistor T1 may be initialized to the first initialization voltage VINT1 as the fourth transistor T4 is turned on.

The fifth transistor T5 (or the first emission control transistor) may be electrically connected between the first power line PL1 (or the first driving voltage line) and the second node N2. A gate electrode of the fifth transistor T5 may be electrically connected to the i-th emission control line Ei (hereinafter, referred to as the emission control line). The fifth transistor T5 may be turned on when an emission control signal is supplied to the emission control line Ei, and may be turned off in the other cases.

The sixth transistor T6 (or second emission control transistor) may be electrically connected between the second electrode (i.e. the third node N3) and the fourth node N4 of the first transistor T1. A gate electrode of the sixth transistor T6 may be electrically connected to the emission control line Ei. The sixth transistor T6 may be controlled in the substantially the same manner as the fifth transistor T5.

The fifth transistor T5 and the sixth transistor T6 may be turned on in response to an emission control signal supplied through the emission control line Ei, and form a flow path for driving current between the first power line PL1 and the fourth node N4 (or between the first power line PL1 and the second power line PL2).

FIG. 4 illustrates that the fifth transistor T5 and the sixth transistor T6 are illustrated as being electrically connected to the same emission control line Ei. However, this is merely illustrative. The fifth transistor T5 and the sixth transistor T6 may be respectively connected to separate emission control lines to which different emission control signals are supplied.

The seventh transistor T7 (or second initialization transistor) may be electrically connected between the fourth node N4 and the third power line PL3. A gate electrode of the seventh transistor T7 may be electrically connected to a third scan line S3*i*. When the scan signal is supplied to the third scan line S3*i*, the seventh transistor T7 may be turned on to supply the initialization voltage VINIT to the fourth node N4.

The storage capacitor Cst is electrically connected between the first power line PL1 and the first node N1. The storage capacitor Cst may store a differential voltage between the first driving voltage ELVDD by the first power line PL1 and the voltage obtained by subtracting the absolute threshold voltage of the first transistor T1 from the data voltage applied to the first node N1.

In an embodiment, after the scan signal is supplied to the second scan line S2*i*, the scan signal may be supplied to the first scan line S1*i*. For example, the scan signal supplied to the second scan line S2*i* and the scan signal supplied to the first scan line S1*i* may be supplied with a difference of one horizontal period. In an embodiment, a scan signal may be simultaneously applied to the third scan line S3*i* and the first scan line S1*i*. However, the embodiment described herein is not limited thereto. After the scan signal is supplied to the third scan line S3*i*, the scan signal may be supplied to the first scan line S1*i*. For example, a supply interval between the scan signal supplied to the third scan line S3*i* and the scan signal supplied to the first scan line S1*i* may be one horizontal period. Alternatively, after the scan signal is supplied to the first scan line S1*i*, the scan signal may be supplied to the third scan line S3*i*.

The sensor circuit SSC may include a first sensor transistor FT1, a second sensor transistor FT2, and a third sensor transistor FT3.

The second sensor transistor FT2 and the third sensor transistor FT3 may be electrically connected in series between a sensing power line PL4 (or a fourth power line) and a j-th fingerprint sensing line FSLj (hereinafter referred to as a fingerprint sensing line).

The first sensor transistor FT1 may be electrically connected between a previous sensing scan line SSi−1 and the fifth node N5 (or the first electrode of the light-receiving element OPD). The gate electrode of the first sensor transistor FT1 may be electrically connected to an i-th sensing scan line SSi (hereinafter referred to as a sensing scan line). The first sensor transistor FT1 may be turned on by the sensing scan signal supplied to the sensing scan line SSi to supply the voltage supplied to the previous sensing scan line SSi−1 to the fifth node N5. The first sensor transistor FT1 may be used to reset (or initialize) the voltage of the fifth node N5.

The gate electrode of the second sensor transistor FT2 may be electrically connected to the fifth node N5. The second sensor transistor FT2 may generate a sensing current flowing from the sensing power line PL4 to the fingerprint sensing line FSLj based on the voltage of the fifth node N5 by the photocurrent generated by the light-receiving element OPD.

In an embodiment, the gate electrode of the third sensor transistor FT3 may be electrically connected to an i−1-th sensing scan line SSi−1 (hereinafter referred to as a previous sensing scan line). When the sensing scan signal is supplied to the previous sensing scan line SSi−1, the third sensor transistor FT3 may be turned on to electrically connect the second sensor transistor FT2 and the fingerprint sensing line FSLj. Then, the sensing signal (sensing current) may be supplied to the fingerprint detector FPDP through the fingerprint detection line FSLj.

The first to seventh transistors T1 to T7 included in the pixel circuit PXC and the first to third sensor transistors FT1 to FT3 included in the sensor circuit SSC may be P-type transistors (e.g. PMOS transistors). However, the embodiment described herein is not limited thereto. According to an embodiment, at least one of the first to seventh transistors T1 to T7 and the first to third sensor transistors FT1 to FT3 may be implemented as N-type transistors (e.g. NMOS transistors). When the first to seventh transistors T1 to T7 and the first to third sensor transistors FT1 to FT3 are the N-type transistors, the positions of the source area (or source electrode) and the drain area (or drain electrode) may be switched.

Figure 5:
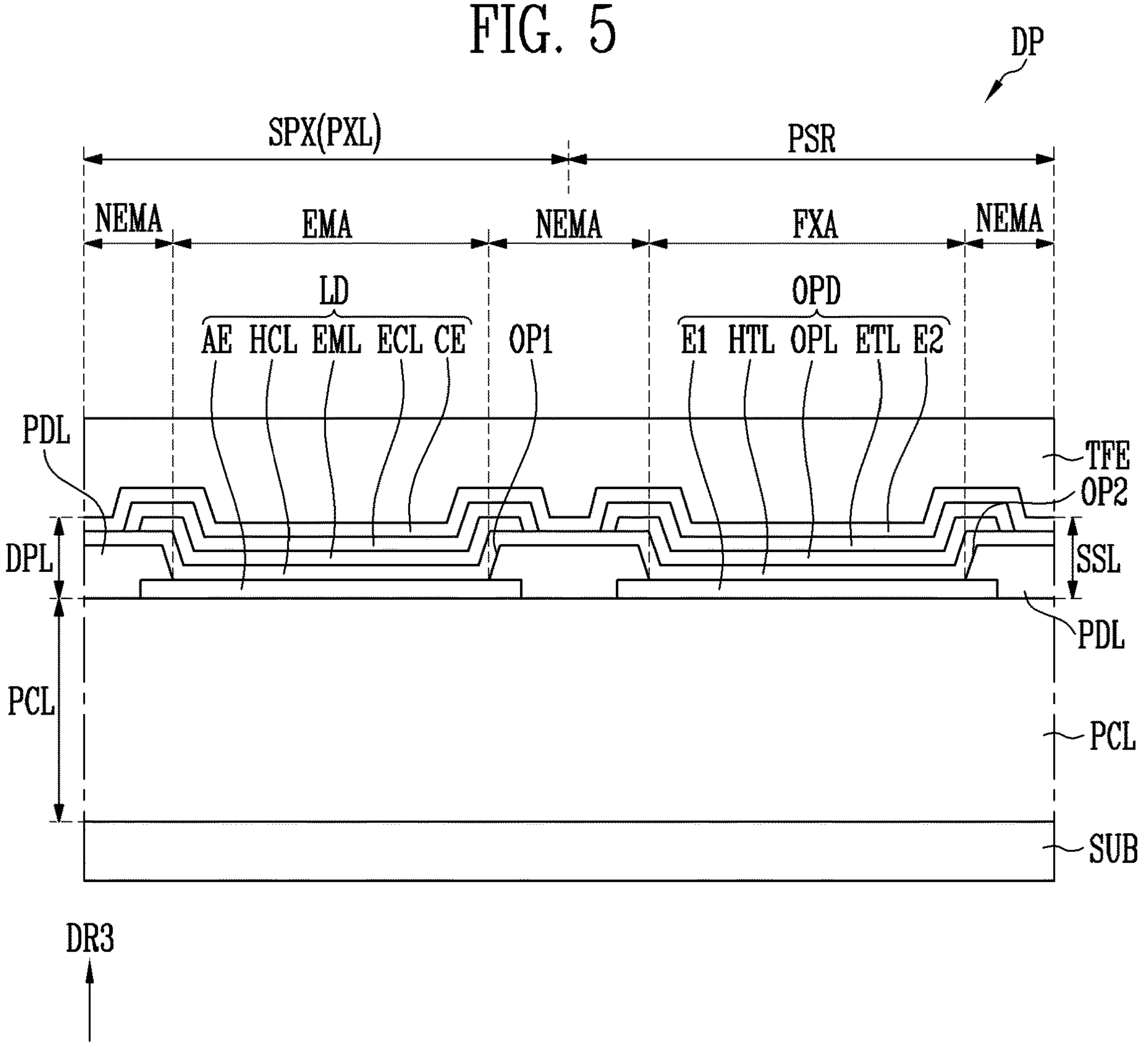
FIG. 5 is an enlarged schematic cross-sectional view of a portion of the display panel of FIG. 3.

FIG. 5 is an enlarged schematic cross-sectional view of a portion of the display panel DP of FIG. 3.

Referring to FIGS. 1 to 5, the display panel DP may include at least one sub-pixel SPX (or pixel PXL) and at least one photo-sensing pixel PSR The sub-pixel SPX may be disposed in a pixel area included in the display area DA. In an embodiment, the pixel area may include an emission area EMA and a non-emission area NEMA provided adjacent to the emission area EMA. The photo-sensing pixel PSR may include the light-receiving area FXA and the non-emission area NEMA adjacent to the light-receiving area FXA.

The sub-pixel SPX may include a pixel circuit layer PCL, a display element layer DPL, and a thin-film encapsulation layer TFE, which are sequentially disposed on the substrate SUB. The photo-sensing pixel PSR may include a substrate SUB, a pixel circuit layer PCL, a sensor layer SSL, and a thin-film encapsulation layer TFE, which are sequentially disposed on the substrate SUB.

The pixel circuit layer PCL of the sub-pixel SPX may include a pixel circuit PXC provided on the substrate SUB and signal lines electrically connected to the pixel circuit PXC. Further, the pixel circuit layer PCL of the sub-pixel SPX may include at least one insulating layer positioned between components included in the pixel circuit PXC.

A display element layer DPL may be formed on the pixel circuit layer PCL of the sub-pixel SPX. The display element layer DPL may include a light-emitting element LD configured to emit light. The light-emitting element LD may include an anode electrode AE, an emission layer EML, and a cathode electrode CE. The light-emitting element LD may be a top-emission type organic light-emitting element. The anode electrode AE may be electrically connected to the pixel circuit PXC.

The display element layer DPL of the sub-pixel SPX may include a pixel defining layer PDL including a first opening OP1 that exposes a portion of the anode electrode AE. The pixel defining layer PDL may be provided on the anode electrode AE and the pixel circuit layer PCL. Furthermore, the display element layer DPL may include a hole control layer HCL and an electron control layer ECL that are provided in common on the emission area EMA and the emission area NEMA. The hole control layer HCL may include a hole transport layer, and may further include a hole injection layer. The hole control layer HCL may be provided on the anode electrode AE exposed by the first opening OP1 of the pixel defining layer PDL and on the pixel defining layer PDL. The emission layer EML may be provided on at least the hole control layer HCL of the emission area EMA. An electron control layer ECL may be disposed on the emission layer EML. The electron control layer ECL may include an electron transport layer, and may further include an electron injection layer. The cathode electrode CE may be provided on the electron control layer ECL.

The pixel circuit layer PCL of the photo-sensing pixel PSR may include a sensor circuit SSC provided on the substrate SUB and signal lines electrically connected to the sensor circuit SSC. Further, the pixel circuit layer PCL of the photo-sensing pixel PSR may include at least one insulating layer positioned between components included in the sensor circuit SSC.

A sensor layer SSL may be formed on the pixel circuit layer PCL of the photo-sensing pixel PSR. The sensor layer SSL may include a light-receiving element OPD that receives light. The light-receiving element OPD may include a first electrode E1, a light-receiving layer OPL, and a second electrode E2. The first electrode E1 may be electrically connected to the sensor circuit SSC.

The sensor layer SSL of the photo-sensing pixel PSR may include a pixel defining layer PDL including a second opening OP2 that exposes a portion of the first electrode E1. The pixel defining layer PDL may be the pixel defining layer PDL of the sub-pixel SPX. The pixel defining layer PDL may be provided on the first electrode E1 and the pixel circuit layer PCL. Furthermore, the sensor layer SSL may include a hole transport layer HTL and an electron transport layer ETL that are provided in common on the photo-sensing area FXA and the non-emission area NEMA. The hole transport layer HTL may be formed through the same process using the same material as the hole control layer HCL of the sub-pixel SPX. The hole transport layer HTL may be disposed between the first electrode E1 and the light-receiving layer OPL. The light-receiving layer OPL may be disposed on at least the hole transport layer HTL of the light-receiving area FXA. The electron transport layer ETL may be formed through the same process using the same material as the electron control layer ECL of the sub-pixel SPX. The second electrode E2 may be provided on the electron control layer ECL.

In an embodiment, the cathode electrode CE of the sub-pixel SPX and the second electrode E2 of the photo-sensing pixel PSR may be formed of the same material by the same process. Further, as shown in FIG. 4, the cathode electrode CE and the second electrode E2 may be electrically connected to the second power line PL2 that transmits the voltage of the second driving power source ELVSS.

The thin-film encapsulation layer TFE may be provided and/or formed on the display element layer DPL of the sub-pixel SPX and the sensor layer SSL of the photo-sensing pixel PSR.

The thin-film encapsulation layer TFE may be formed of a single layer, or multi-layers. The thin-film encapsulation layer TFE may include a plurality of insulating layers configured to cover the light-emitting element LD and the light-receiving element OPD. In detail, the thin-film encapsulation layer TFE may include at least one inorganic layer and at least one organic layer. For example, the thin-film encapsulation layer TFE may have a structure formed by alternately stacking the inorganic layers and the organic layers. In some embodiments, the thin-film encapsulation layer TFE may be an encapsulation substrate that is disposed on the light-emitting element LD and the light-receiving element OPD and is joined to the substrate SUB through a sealant.

Figure 6:
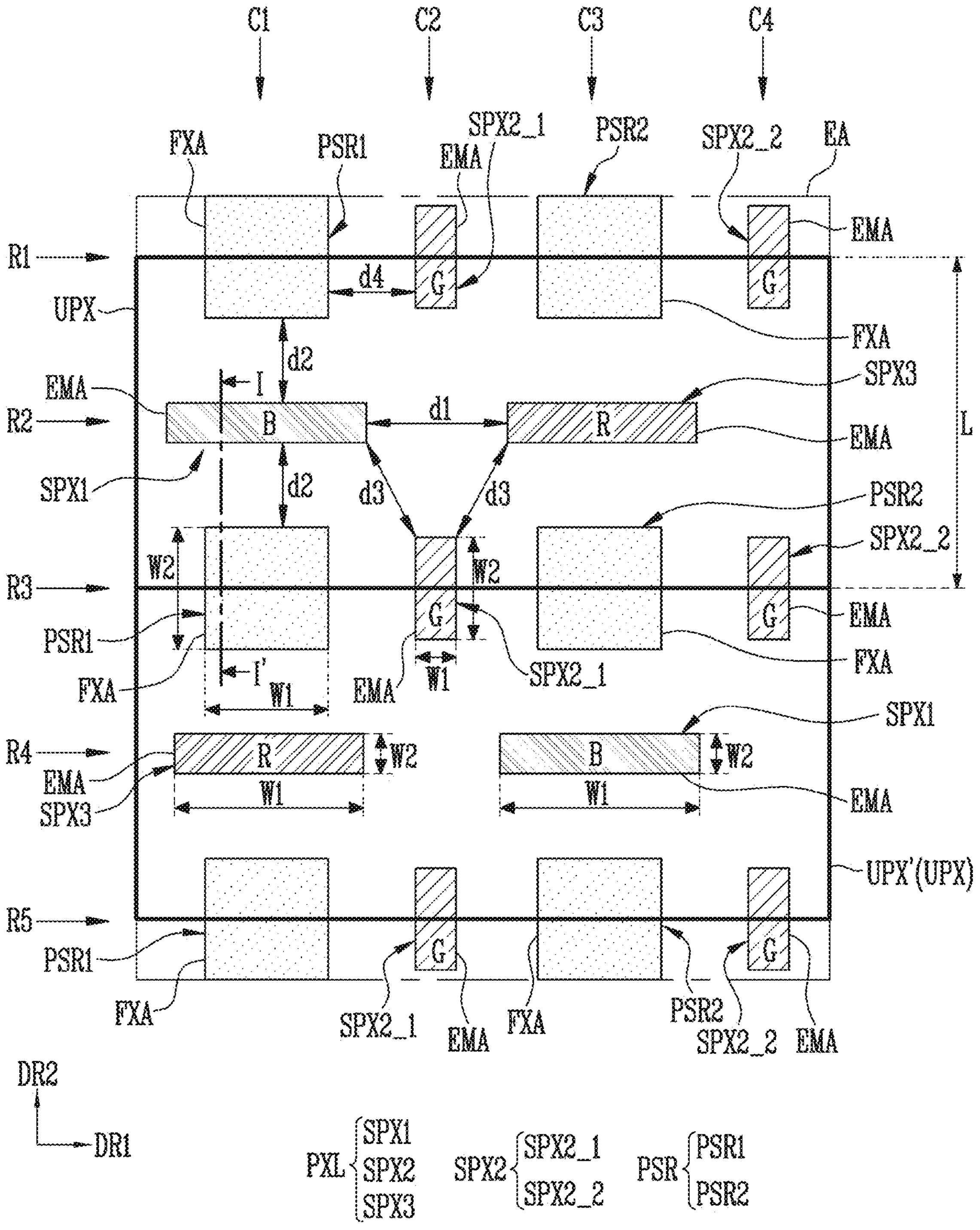
FIG. 6 is a schematic enlarged view of portion EA of FIG. 2.

FIG. 6 is a schematic enlarged view of portion EA of FIG. 2.

In an embodiment, the first sub-pixel SPX1, the second sub-pixel SPX2, and the third sub-pixel SPX3 may indicate the emission area EMA of each sub-pixel, and the emission area EMA may be defined by the first opening (Cf. "OP1" of FIG. 5) of the pixel defining layer (Cf. "PDL" of FIG. 5). Further, in an embodiment, the photo-sensing pixel PSR may indicate the light-receiving area FXA of the photo-sensing pixel PSR, and the light-receiving area FXA may be defined by the second opening (Cf. "OP2" of FIG. 5) of the pixel defining layer PDL.

For the sake of explanation, in FIG. 6, a transverse direction (or a horizontal direction) on a plane is indicated as a first direction DR1, and a longitudinal direction (or a vertical direction) on a plane is indicated as a second direction DR2.

Referring to FIGS. 2, 5, and 6, the sub-pixels SPX1, SPX2, and SPX3 (or the pixels PXL) disposed in the display area DA may be disposed in a PENTILE™ structure. The first sub-pixel SPX1 (or the first pixel), the second sub-pixel SPX2 (or the second pixel), and the third sub-pixel SPX3 (or the third pixel) may emit (form) light of different colors. For example, the first sub-pixel SPX1 may emit (or from) blue light B, the second sub-pixel SPX2 may emit (or form) green light G, and the third sub-pixel SPX3 may emit (or form) red light R.

The photo-sensing pixel PSR and the second sub-pixel SPX2 may be alternately disposed in a first row R1. The first sub-pixel SPX1 and the third sub-pixel SPX3 may be alternately disposed in the second row R2 that is adjacent to the first row R1 in the second direction DR2. The photo-sensing pixel PSR and the second sub-pixel SPX2 may be alternately disposed in the third row R3 that is adjacent to the second row R2 in the second direction DR2. The third sub-pixel SPX3 and the first sub-pixel SPX1 may be alternately disposed in the fourth row R4 that is adjacent to the third row R3 in the second direction DR2. The photo-sensing pixel PSR and the second sub-pixel SPX2 may be alternately disposed in the fifth row R5 that is adjacent to the fourth row R4 in the second direction DR2.

The second sub-pixels SPX2 disposed in the first row R1 may be disposed alternately with the first sub-pixel SPX1 and the third sub-pixel SPX3 disposed in the second row R2. The second sub-pixels SPX2 disposed in the third row R3 may be disposed alternately with the first sub-pixel SPX1 and the third sub-pixel SPX3 disposed in the second row R2. Further, the second sub-pixels SPX2 disposed in the third row R3 may be disposed alternately with the third sub-pixel SPX3 and the first sub-pixel SPX1 disposed in the fourth row R4. The second sub-pixels SPX2 disposed in the fifth row R5 may be disposed alternately with the third sub-pixel SPX3 and the first sub-pixel SPX1 disposed in the fourth row R4.

The photo-sensing pixel PSR disposed in the first row R1, the first sub-pixel SPX1 disposed in the second row R2, the photo-sensing pixel PSR disposed in the third row R3, the third sub-pixel SPX3 disposed in the fourth row R4, and the photo-sensing pixel PSR disposed in the fifth row R5 are positioned in the same column (e.g. first column C1).

The second sub-pixel SPX2 of the first row R1, the second sub-pixel SPX2 of the third row R3, and the second sub-pixel SPX2 of the fifth row R5 may be disposed in a second column C2 that is adjacent to the first column C1 in the first direction DR1.

The photo-sensing pixel PSR of the first row R1, the third sub-pixel SPX3 of the second row R2, the photo-sensing pixel PSR of the third row R3, the first sub-pixel SPX1 of the fourth row R4, and the photo-sensing pixel PSR of the fifth row R5 may be disposed in a third column C3 that is adjacent to the second column C2 in the first direction DR1.

The second sub-pixel SPX2 of the first row R1, the second sub-pixel SPX2 of the third row R3, and the second sub-pixel SPX2 of the fifth row R5 may be disposed in a fourth column C4 that is adjacent to the third column C3 in the first direction DR1.

Hereinafter, for the sake of explanation, the second sub-pixel SPX2 positioned in the second column C2 is referred to as a 2-1-th sub-pixel SPX2_1, and the second sub-pixel SPX2 positioned in the fourth column C4 is referred to as a 2-2-th sub-pixel SPX2_2.

A plurality of unit pixels UPX that are repeatedly arranged may be disposed in the display area DA.

Each of the unit pixels UPX may include predetermined sub-pixels SPX1, SPX2, and SPX3 and predetermined photo-sensing pixels PSR. For example, one unit pixel UPX may include the first and third sub-pixels SPX1 and SPX3 that are positioned in the same row (e.g. the second row R2) and are adjacent to each other in the first direction DR1, two photo-sensing pixels PSR (hereinafter referred to as the first photo-sensing pixels PSR1) that are positioned in the same column (e.g. the first column C1) as the first sub-pixel SPX1, two 2-1-th sub-pixels SPX2_1 (also referred to herein as a first pair of second sub-pixels) that are positioned in the same rows (e.g. the first and third rows R1 and R3) as the first photo-sensing pixels PSR1 and are positioned in an adjacent column (e.g. the second column C2), two photo-sensing pixels PSR (hereinafter referred to as the second photo-sensing pixels PSR2) that are positioned in the same column (e.g. the third column C3) as the third sub-pixel SPX3, and two 2-2-th sub-pixels SPX2_2 (also referred to herein as a second pair of second sub-pixels) that are positioned in the same row as the second photo-sensing pixels PSR2 and are positioned in an adjacent column (e.g. the fourth column C4). The first photo-sensing pixels PSR1 may face each other with the first sub-pixel SPX1 interposed therebetween in the corresponding unit pixel UPX, and the second photo-sensing pixels PSR2 may face each other with the third sub-pixel SPX3 interposed therebetween in the corresponding unit pixel UPX One unit pixel UPX and an adjacent unit pixel UPX' adjacent to the unit pixel UPX in the second direction DR2 may share one first photo-sensing pixel PSR1, one second photo-sensing pixel PSR2, one 2-1-th sub-pixel SPX2_1, and one 2-2-th sub-pixel SPX2_2.

Each of one first sub-pixel SPX1, multiple second sub-pixels SPX2, and one third sub-pixel SPX3 included in one unit pixel UPX may include an emission area EMA. Each of the first photo-sensing pixels PSR1 and the second photo-sensing pixels PSR2 included in the corresponding unit pixel UPX may include a light-receiving area FXA.

Components positioned in one unit pixel UPX may be arranged to be spaced apart from each other by a predetermined distance.

In the one unit pixel UPX, the first sub-pixel SPX1 and the third sub-pixel SPX3 may be spaced apart from each other by a first distance dlin the first direction DR1. In the unit pixel UPX, the first sub-pixel SPX1 and each of the first photo-sensing pixels PSR1 may be spaced apart from each other by a second distance d2 in the second direction DR2. The first distance d1 and the second distance d2 may be different from each other. For instance, the first distance d1 may be greater than the second distance d2. To be more specific, the distance d1 between the first sub-pixel SPX1 and the third sub-pixel SPX3 may be greater than the distance d2 between the first sub-pixel SPX1 and each of the first photo-sensing pixels PSR1. The first distance d1 and the second distance d2 may be designed to have a width equal to or more than a minimum CD width (e.g. 16.5 μm) required by the display device DD, but are not limited thereto. The first distance d1 and the second distance d2 may be determined according to the resolution of the display device DD. In an embodiment, the minimum CD width may denote a minimum distance between the sub-pixels within a range in which light (e.g. blue light B) emitted from each sub-pixel (e.g. the first sub-pixel SPX1) and light (e.g. red light R) emitted from the adjacent sub-pixel (e.g. the third sub-pixel SPX3) adjacent to the corresponding sub-pixel are not affected by each other.

In the one unit pixel UPX, the first sub-pixel SPX1 (or the third sub-pixel SPX3 and each of the second sub-pixels SPX2) positioned in different rows may be spaced apart from each other in an oblique direction inclined in the first direction DR1 while having a third distance d3 therebetween. The third distance d3 may be different from each of the first and second distances d1 and d2, but the present disclosure is not limited thereto. According to an embodiment, the third distance d3 may be the same as the first distance d1, or may be the same as the second distance d2. The third distance d3 may also be designed to be 16.5 μm or more, but is not limited thereto. The third distance d3 may be determined according to the resolution of the display device DD.

Each of the photo-sensing pixels PSR and each of the second sub-pixels SPX2 positioned in the same row in the one unit pixel UPX may be spaced apart from each other in the first direction DR1 while having the fourth distance d4 therebetween. The fourth distance d4 may be equal to or different from the first to third distances d1 to d3. The fourth distance d4 may be designed to be 16.5 μm or more, but is not limited thereto. The fourth distance d4 may be determined according to the resolution of the display device DD.

In the above-described embodiment, each of the sub-pixels SPX1, SPX2, and SPX3 included in each unit pixel UPX may have an emission area EMA having the shape of a quadrangular plane and defined (or partitioned) by the pixel defining layer PDL, and each of the photo-sensing pixels PSR may have a light-receiving area FXA having the shape of a quadrangular plane and defined (or partitioned) by the pixel defining layer PDL. For example, each of the sub-pixels SPX1, SPX2, and SPX3 included in one unit pixel UPX may have the emission area EMA having the shape of a rectangular plane whose horizontal width W1 and vertical width W2 are different from each other, and each of the photo-sensing pixels PSR included in the corresponding unit pixel UPX may have the light-receiving area FXA having the shape of a square plane whose horizontal width W1 and vertical width W2 are equal to each other.

The emission area EMA of the first sub-pixel SPX1 may be an area that emits blue light B, the emission area EMA of each of the second sub-pixels SPX2 may be an area that emits green light G, and the emission area EMA of the third sub-pixel SPX3 may be an area that emits red light R. The light-receiving area FXA of each of the photo-sensing pixels PSR may be an area receiving light R, G, and B emitted from the first to third sub-pixels SPX1, SPX2, and SPX3.

In the above-described embodiment, the length L of one unit pixel UPX in the second direction DR2 may be determined according to the resolution of the display device DD. When the length L of one unit pixel UPX is determined, the sectional area (the horizontal width W1 and the vertical width W2) of the second sub-pixel SPX2 that finally emits the green light G may be determined according to a predetermined ratio of the red light, the green light, and the blue light within the unit pixel UPX. In other words, when the sectional area (or size) of the emission area EMA of the second sub-pixel SPX2 is determined, the sectional area (or size) of the emission area EMA of each of the first and third sub-pixels SPX1 and SPX3 may be determined. For example, the sectional area of each of the first to third sub-pixels SPX1, SPX2, and SPX3 in the corresponding unit pixel UPX may be determined to have an emission area EMA having the shape of a rectangular plane. Thus, at least one photo-sensing pixel PSR including a light-receiving element OPD may be disposed within the corresponding unit pixel UPX.

In the case of a display device including an optical sensor attached to the rear surface of the substrate, light that is emitted from the light-emitting element, is reflected by a user's finger and is incident on the optical sensor has a long propagation path, so that the sensing ability of the optical sensor may be deteriorated, and the optical sensor is attached to the rear surface of the substrate, so that the entire thickness of the display device may be increased.

In order to realize a slimmer display device and prevent the loss of light propagated to the optical sensor, in the above-described embodiment, the photo-sensing pixel PSR including the light-receiving element OPD is disposed adjacent to the sub-pixels SPX1, SPX2, and SPX3 in one unit pixel UPX.

In order to secure the sectional area of the photo-sensing pixel PSR (or the light-receiving area FXA) positioned in one unit pixel UPX and thereby increase the amount of light incident on the light-receiving element OPD, the pixel defining layer PDL is designed such that each of the sub-pixels SPX1, SPX2, and SPX3 positioned in the corresponding unit pixel UPX includes the emission area EMA having the shape of a rectangular plane, and the photo-sensing pixel PSR includes the light-receiving area FXA having the shape of a square plane. Particularly, when each of the sub-pixels SPX1, SPX2, and SPX3 in one unit pixel UPX includes an emission EMA having the shape of a rectangular plane, a sectional area occupied by the photo-sensing pixel PSR in the corresponding unit pixel UPX is further secured, so that restrictions on the installation of the photo-sensing pixel PSR may be reduced according to the resolution of the display device DD.

If the emission EMA of each of the sub-pixels SPX1, SPX2, and SPX3 within each unit pixel UPX has a diamond shape, the available space of the corresponding unit pixel UPX is insufficient, so that it may not be easy to dispose the photo-sensing pixel PSR including the light-receiving element OPD in the unit pixel UPX. When the size of the emission EMA of each of the sub-pixels SPX1, SPX2, and SPX3 positioned in each unit pixel UPX is reduced to allow the photo-sensing pixel PSR including the light-receiving element OPD to be disposed in each unit pixel UPX, the sectional area of the emission EMA within the corresponding unit pixel UPX may be reduced, so that light output efficiency may be reduced. Further, the photo-sensing pixel PSR also does not secure a sufficient sectional area, so that the amount of light that is reflected by the user's finger and is incident to the photo-sensing pixel PSR is reduced, and thereby the user's fingerprint may not be accurately sensed.

Thus, in the above-described embodiment, the emission area EMA of each of the sub-pixels SPX1, SPX2, and SPX3 positioned within each unit pixel UPX is designed to have the shape of a rectangular plane, and the light-receiving area FXA of at least one photo-sensing pixel PSR within the corresponding unit pixel UPX is designed to have the shape of a square plane, so that the light-receiving area FXA may be sufficiently secured within the corresponding unit pixel UPX. Thus, in the above-described embodiment, the sensing capability (or sensing accuracy, recognition rate) of the photo-sensing pixel PSR may be improved by increasing the amount of light introduced into (or incident on) the photo-sensing pixel PSR. Further, in the above-described embodiment, as the emission area EMA of each of the sub-pixels SPX1, SPX2, and SPX3 positioned within each unit pixel UPX is not reduced, the emission luminance of each of the sub-pixels SPX1, SPX2, and SPX3 may not be reduced.

Hereinafter, the stacked structure of each of the sub-pixels SPX1, SPX2, and SPX3 including the light-emitting element LD and the photo-sensing pixels PSR including the light-receiving element OPD will be mainly described with reference to FIGS. 7 and 8.

Figure 7:
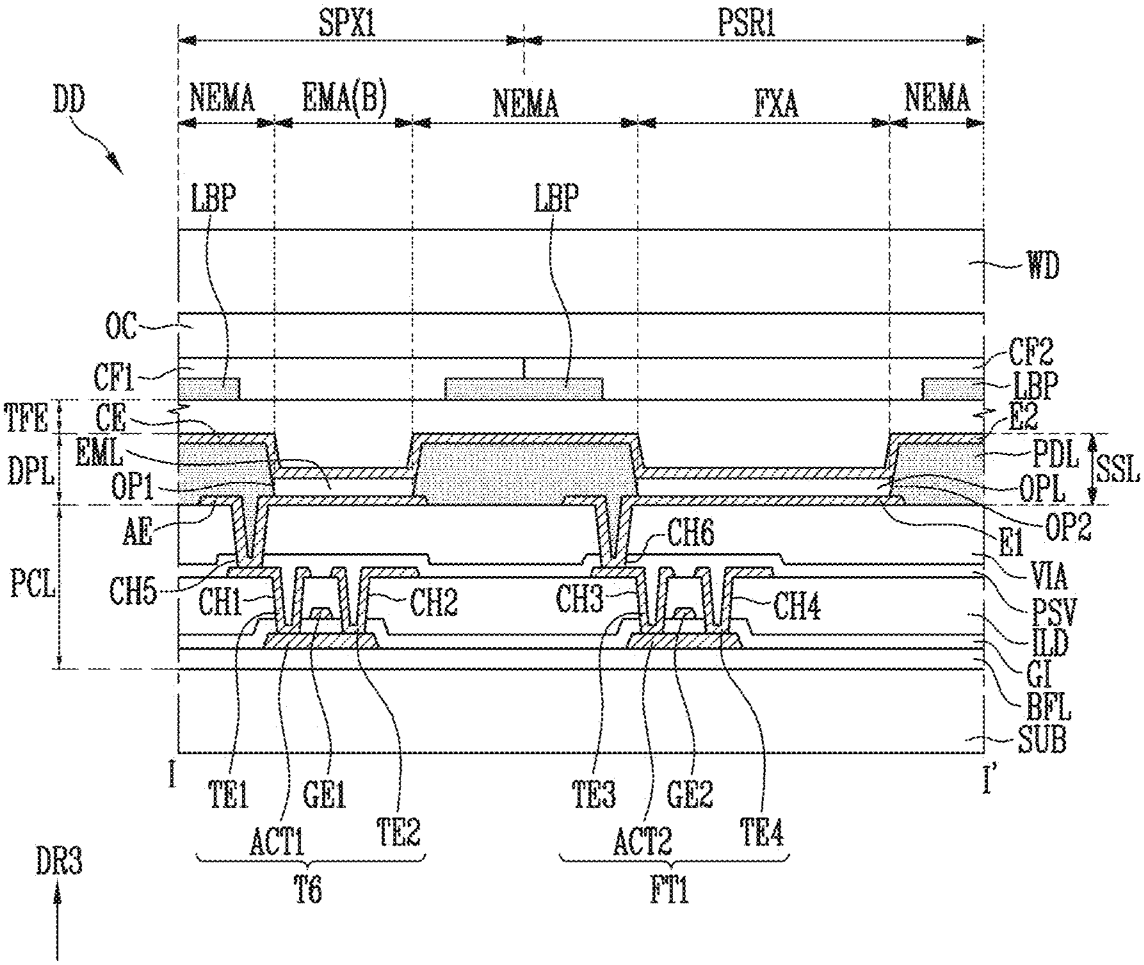
FIG. 7 is a schematic cross-sectional view taken along line I-I' of FIG. 6.
Figure 8:
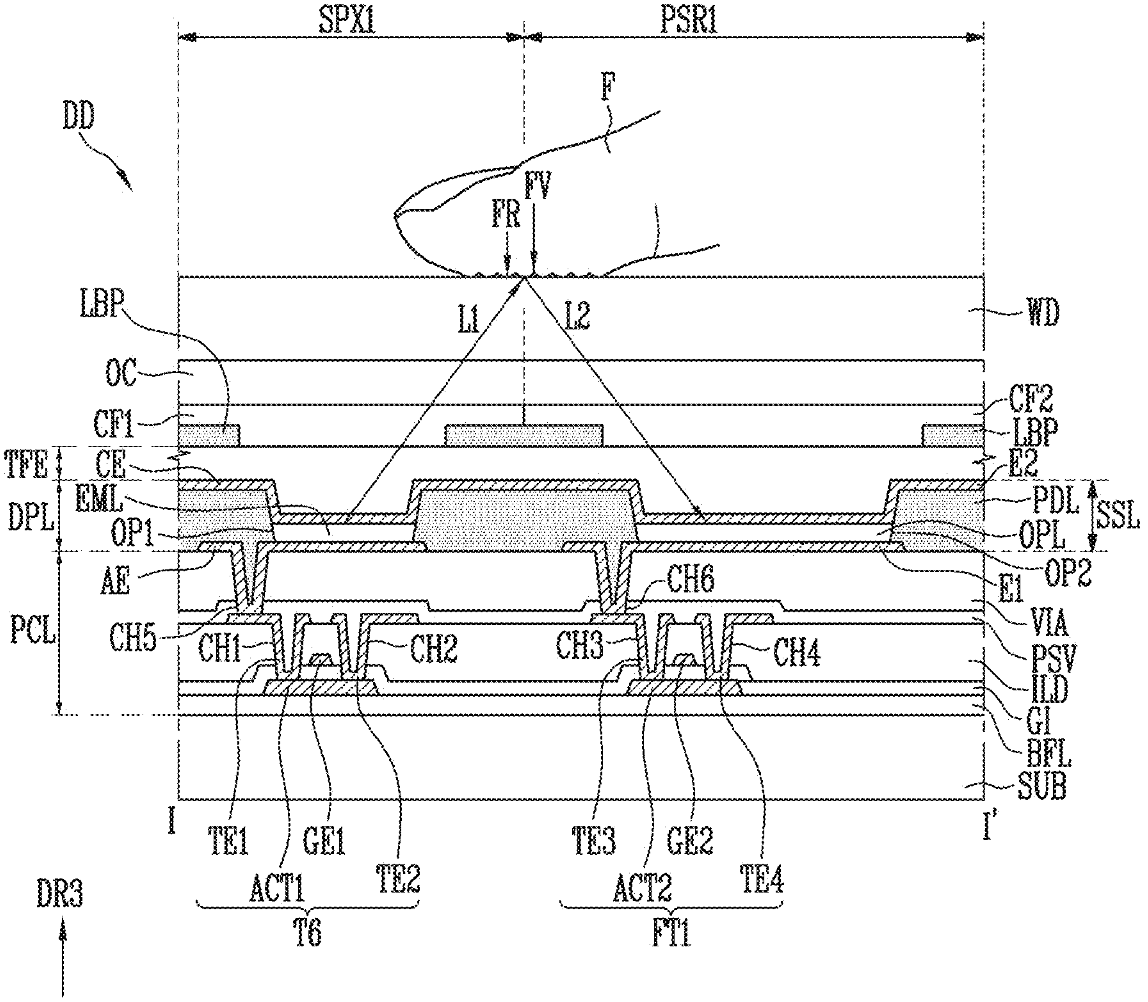
FIG. 8 is a schematic cross-sectional view illustrating a light reflection path in the display device of FIG. 7.

FIG. 7 is a schematic cross-sectional view taken along line I-I' of FIG. 6, and FIG. 8 is a schematic cross-sectional view illustrating a light reflection path in the display device DD of FIG. 7.

In the description of embodiments described herein, "components are provided and/or formed on the same layer" may denote that the components are formed through the same process, and "components are provided and/or formed on different layers may denote that the components are formed through different processes.

For the sake of explanation, in FIGS. 7 and 8, the sectional structure of each sub-pixel will be described by taking the first sub-pixel SPX1 among the sub-pixels SPX1, SPX2, and SPX3 as an example. For the sake of explanation, in FIGS. 7 and 8, a sectional structure of each photo-sensing pixel PSR will be described by taking the first photo-sensing pixel PSR1 among the photo-sensing pixels PSR as an example.

Further, FIGS. 7 and 8 illustrate only a section of a portion corresponding to the sixth transistor T6 among the first to seventh transistors T1 to T7 shown in FIG. 4 and a section of a portion corresponding to the first sensor transistor FT1 among the first to third sensor transistors FT1 to FT3.

Further, in FIGS. 7 and 8, a longitudinal direction (or a vertical direction) on the section is indicated as the third direction DR3.

In FIGS. 7 and 8, differences from the above-described embodiment will be mainly described for ease in explanation of the embodiment.

Referring to FIGS. 1 to 8, the display device DD may include a first sub-pixel SPX1 and a first photo-sensing pixel PSR1 disposed in a substrate SUB.

The substrate SUB may include transparent insulating material to allow light transmission. The substrate SUB may be a rigid substrate or a flexible substrate.

For example, the rigid substrate may be one of a glass substrate, a quartz substrate, a glass ceramic substrate, and a crystalline glass substrate.

The flexible substrate may be either a film substrate or a plastic substrate that includes polymer organic material. For example, the flexible substrate SUB may include at least one of the following: polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate.

The pixel circuit layer PCL of the first sub-pixel SPX1 and the pixel circuit layer PCL of the first photo-sensing pixel PSR1 may be provided in the substrate SUB. The pixel circuit layer PCL includes a buffer layer BFL, a gate insulating layer GI, an interlayer insulating layer ILD, a passivation layer PSV, and a via layer VIA, which are sequentially stacked on the substrate SUB in the third direction DR3.

The buffer layer BFL may prevent impurities from diffusing into the sixth transistor T6 included in the pixel circuit PXC and the first sensor transistor FT1 included in the sensor circuit SSC. The buffer layer BFL may be an inorganic insulating layer including inorganic material. The buffer layer BFL may include at least one of metal oxides such as silicon nitride ($SiN_x$), silicon oxide ($SiO_x$), silicon oxynitride ($SiO_xN_y$), and aluminum oxide ($AlO_x$). The buffer layer BFL may be provided in a single layer structure or a multilayer structure having at least two or more layers. In case that the buffer layer BFL has a multi-layer structure, the respective layers may be formed of the same material or different materials. The buffer layer BFL may be omitted depending on the material of the substrate SUB or processing conditions.

A semiconductor layer (or a semiconductor pattern) including a first active pattern ACT1 and a second active pattern ACT2 may be disposed on the buffer layer BFL. The semiconductor layer may include a polysilicon semiconductor. For example, the semiconductor layer may be formed through a low-temperature polysilicon (LTPS) process. However, without being limited thereto, at least a portion of the semiconductor layer may be formed of an oxide semiconductor, a metal oxide semiconductor, etc.

Each of the first and second active patterns ACT1 and ACT2 may include a channel area, a first contact area electrically connected to a first end of the channel area, and a second contact area electrically connected to a second end of the channel area. The channel area, the first contact area, and the second contact area may be formed of a semiconductor layer that is not doped with an impurity or is doped with an impurity. For example, the first contact area and the second contact area may be formed of a semiconductor layer that is doped with the impurity, and the channel area may be formed of a semiconductor layer that is not doped with the impurity. A p-type impurity may be used as the impurity, but the embodiment described herein is not limited thereto. One of the first and second contact areas may be a source area, and the other may be a drain area.

A gate insulating layer GI may be entirely provided and/or formed on the first and second active patterns ACT1 and ACT2 and the buffer layer BFL.

The gate insulating layer GI may be an inorganic layer (or an inorganic insulating layer) containing an inorganic material. For example, the gate insulating layer GI may include at least one of metal oxides such as silicon nitride ($SiN_x$), silicon oxide ($SiO_x$), silicon oxynitride ($SiO_xN_y$), and aluminum oxide ($AlO_x$). However, the material of the gate insulating layer GI is not limited to the above-described embodiments. In some embodiments, the gate insulating layer GI may be formed of an organic layer (or an organic insulating layer) including an organic material. The gate insulating layer GI may be provided in a single layer structure or a multilayer structure having at least two or more layers.

A first gate electrode GE1 and a second gate electrode GE2 may be provided and/or formed on the gate insulating layer GI. The first gate electrode GE1 may be provided and/or formed on the gate insulating layer GI to correspond to the channel area of the first active pattern ACT1, and the second gate electrode GE1 may be provided and/or formed on the gate insulating layer GI to correspond to the channel area of the second active pattern ACT2 The first and second gate electrodes GE1 and GE2 may be a single layer structure formed of a single material or a mixture of materials, which are selected from a group consisting of copper (Cu), molybdenum (Mo), tungsten (W), aluminum neodymium (AlNd), titanium (Ti), aluminum (Al), silver (Ag), and alloys thereof, or may be a double layer structure or a multi-layer structure formed of molybdenum (Mo), titanium (Ti), copper (Cu), aluminum (Al), or silver (Ag), which are low-resistance materials so as to reduce line resistance.

The interlayer insulating layer ILD may be entirely provided and/or formed on the first and second gate electrodes GE1 and GE2 and the gate insulating layer GI.

The interlayer insulating layer ILD may include the same material as the gate insulating layer GI, or may include at least one material selected from materials utilized as a material for forming the gate insulating layer GI.

First, second, third, and fourth connecting members TE1, TE2, TE3, and TE4 may be provided and/or formed on the interlayer insulating layer ILD.

The first, second, third, and fourth connecting members TE1, TE2, TE3, and TE4 may be disposed on the interlayer insulating layer ILD to be spaced apart from each other.

The first connecting member TE1 may contact a first contact area at the first end of the first active pattern ACT1 through a first contact hole CH1 formed in the interlayer insulating layer ILD and the gate insulating layer GI. When the first contact area is a source area, the first connecting member TE1 may be a first source electrode.

The second connecting member TE2 may contact a second contact area at the second end of the first active pattern ACT1 through a second contact hole CH2 formed in the interlayer insulating layer ILD and the gate insulating layer GI. When the second contact area is a drain area, the second connecting member TE2 may be a second drain electrode.

The third connecting member TE3 may contact a first contact area at the first end of the second active pattern ACT2 through a third contact hole CH3 formed in the interlayer insulating layer ILD and the gate insulating layer GI. When the first contact area is a source area, the third connecting member TE3 may be a second source electrode.

The fourth connecting member TE4 may contact a second contact area at the second end of the second active pattern ACT2 through a fourth contact hole CH4 formed in the interlayer insulating layer ILD and the gate insulating layer GI. When the second contact area is a drain area, the fourth connecting member TE4 may be a second drain electrode.

The first to fourth connecting members TE1 to TE4 may include the same material as the first and second gate electrodes GE1 and GE2 or may include at least one material selected from materials utilized as materials for forming the first and second gate electrodes GE1 and GE2.

A passivation layer PSV may be entirely provided and/or formed on the first to fourth connecting members TE1 to TE4 and the interlayer insulating layer ILD.

The passivation layer PSV (or protective layer) may be an inorganic layer (or an inorganic insulating layer) including an inorganic material or an organic layer (or an organic insulating layer) including an organic material. The inorganic layer may include at least one of metal oxides such as silicon oxide ($SiO_x$), silicon nitride ($SiN_x$), silicon oxynitride ($SiO_xN_y$), and aluminum oxide ($AlO_x$), for example. The organic layer may include, for example, at least one of polyacrylates resin, epoxy resin, phenolic resin, polyamides resin, polyimides rein, unsaturated polyesters resin, polyphenylen ethers resin, poly-phenylene sulfides resin, and benzocyclobutene resin.

In some embodiments, the passivation layer PSV may include the same material as the interlayer insulating layer ILD, but is not limited thereto. The passivation layer PSV may be provided in a single layer structure or a multilayer structure having at least two or more layers.

The passivation layer PSV may be partially opened to include a fifth contact hole CH5 exposing an area of the first connecting member TE1 and a sixth contact hole CH6 exposing an area of the third connecting member TE3.

A via layer VIA may be entirely provided and/or formed on the passivation layer PSV.

The via layer VIA may be partially opened to include fifth and sixth contact holes CH5 and CH6 corresponding to the fifth and sixth contact holes CH5 and CH6 of the passivation layer PSV, respectively. The via layer VIA may include the same material as the passivation layer PSV or may include at least one material selected from materials utilized as constituent materials of the passivation layer PSV. In an embodiment, the via layer VIA may be an organic layer made of an organic material.

Although FIG. 7 illustrates that the via layer VIA is provided on the passivation layer PSV, the present disclosure is not limited thereto. In some embodiments, either of the passivation layer PSV or the via layer VIA may be omitted.

A display element layer DPL may be provided and/or formed on the pixel circuit layer PCL of the first sub-pixel SPX1, and a sensor layer SSL may be provided and/or formed on the pixel circuit layer PCL of the first photo-sensing pixel PSR.

The display element layer DPL may include the light-emitting element LD and the pixel defining layer PDL. The light-emitting element LD may include an anode electrode AE (or a first pixel electrode), an emission layer EML, and a cathode electrode CE (or a second pixel electrode). The light-emitting element LD may be electrically connected to the sixth transistor T6 of the pixel circuit PXC.

The sensor layer SSL may include a light-receiving element OPD and a pixel defining layer PDL. The light-receiving element OPD may be an optical fingerprint sensor. For example, the light-receiving element OPD may be formed of a photo diode, a CMOS image sensor, a CCD camera, a photo transistor, or the like, but is not limited thereto. The light-receiving element OPD may recognize the fingerprint by sensing light reflected by a valley FV between a ridge FR of a finger F and a ridge FR. For example, if the user's finger F contacts the window WD, the first light L1 output from the light-emitting element LD (or the emission layer EML) may be reflected by the ridge FR of the finger F or the valley FV, and the reflected second light L2 may reach the light-receiving element OPD (or the light-receiving layer OPL) of the sensor layer SSL. The light-receiving element OPD may distinguish the second light L2 reflected from the ridge FR of the finger F from the second light L2 reflected from the valley FV of the finger F to recognize the pattern of a user's fingerprint.

The light-receiving element OPD may be electrically connected to the first sensor transistor FT1 of the sensor circuit SSC. The light-receiving element OPD may include a first electrode E1 (or a first sensor electrode), a light-receiving layer OPL (or a photoelectric conversion layer), and a second electrode E2 (or a second sensor electrode).

The anode electrode AE and the first electrode EL1 may be formed of a metal layer made of Ag, Mg, Al, Pt, Pd, Au, Ni, Nd, Ir, Cr, or an alloy of them, and/or ITO (indium tin oxide), IZO (indium zinc oxide), ZnO (zinc oxide), ITZO (indium tin zinc oxide), or the like. The anode electrode AE may be electrically connected to the sixth transistor T6 through the fifth contact hole CH5 formed in the via layer VIA and the passivation layer PSV. The first electrode E1 may be electrically connected to the first sensor transistor FT1 through the sixth contact hole CH6 formed in the via layer VIA and the passivation layer PSV.

The anode electrode AE and the first electrode E1 may be simultaneously formed through the same process using a mask, but the embodiment described herein is not limited thereto.

A pixel defining layer PDL (or a bank) may be entirely provided and/or formed on the anode electrode AE, the first electrode E1, and the via layer VIA.

The pixel defining layer PDL may define (or partition) the emission area EMA of the first sub-pixel SPX1 and the light-receiving area FXA of the first photo-sensing pixel PSR1. The pixel defining layer PDL may be an organic insulating layer made of organic material. The organic material may include acryl resin, epoxy resin, phenolic resin, polyamide resin, polyimide resin, and the like.

In some embodiments, the pixel defining layer PDL may include a light absorbing material, or a light absorbing agent may be applied to the pixel defining layer to absorb light introduced from an outside. For example, the pixel defining layer PDL may include a carbon-based black pigment. However, without being limited thereto, the pixel defining layer PDL may include an opaque metal material having high light absorptivity, such as chromium (Cr), molybdenum (Mo), an alloy (MoTi) of molybdenum (Mo) and titanium (Ti), tungsten (W), vanadium (V), niobium (Nb), tantalum (Ta), manganese (Mn), cobalt (Co) or nickel (Ni).

The pixel defining layer PDL may include a first opening OP1 exposing an area (e.g. a portion of an upper surface) of the anode electrode AE and a second opening OP2 exposing an area (e.g. a portion of an upper surface) of the first electrode E1, and may protrude from the via layer VIA in the third direction DR3 along the perimeter of the emission area EMA and the perimeter of the light-receiving area FXA.

The first opening OP1 of the pixel defining layer PDL may correspond to the emission area EMA, while the second opening OP2 of the pixel defining layer PDL may correspond to the light-receiving area FXA. The pixel defining layer PDL may be patterned to include the rectangular first opening OP1 so that the emission area EMA of the first sub-pixel SPX1 has the shape of a rectangular plane in a process using a mask. In the above-described process, the pixel defining layer PDL may be patterned to include the square second opening OP2 so that the light-receiving area FXA of the first photo-sensing pixel PSR1 has the shape of a square plane.

The emission layer EML may be provided and/or formed on the anode electrode AE exposed by the first opening OP1 of the pixel defining layer PDL. The emission layer EML may include an organic material to emit light of a predetermined color (e.g. blue light B). For example, the emission layer EML may include a hole transporting layer, an organic material layer, and an electron transporting layer.

The light-receiving layer OPL may be provided and/or formed on the first electrode E1 exposed by the second opening OP2 of the pixel defining layer PDL. The light-receiving layer OPL may serve to absorb and detect the second light L2 reflected or scattered from the fingerprint of the user's finger F. In this case, the light-receiving layer OPL may recognize the fingerprint by sensing a difference in the amount of light, which is reflected or scattered from the ridge FR or the valley FV of the fingerprint of the user's finger F, and then is absorbed. A hole and an electron generated when the light-receiving layer OPL absorbs light may be transmitted to the cathode electrode CE and the second electrode E2, respectively.

The light-receiving layer OPL may be formed of an organic photosensitive material. For example, the organic photosensitive material may include a dithiolene-based material (BDN) (bis(4-dimethylaminodithiobenzyl)nickel (II)), a benzotriazole-based polymeric compound (PTZBTTT-BDT), a porphyrin-based small molecule material (DHTBTEZP), and the like. However, the embodiment described herein is not limited thereto.

An electron transporting layer may be provided on the emission layer EML and the light-receiving layer OPL.

A cathode electrode CE may be provided and/or formed on the emission layer EML of the first sub-pixel SPX1, and a second electrode E2 may be provided and/or formed on the light-receiving layer OPL of the first photo-sensing pixel PSR. In an embodiment, the cathode electrode CE and the second electrode E2 may be a common electrode integrally formed in the display area DA. The voltage of the second driving power source ELVSS may be supplied to the cathode electrode CE and the second electrode E2.

The cathode electrode CE and the second electrode E2 may be formed of a metal layer such as Ag, Mg, Al, Pt, Pd, Au, Ni, Nd, Ir, or Cr and/or a transparent conductive layer such as ITO, IZO, ZnO, or ITZO. In an embodiment, the second electrode EL2 may be formed of a multilayer structure having two or more layers including a thin metal layer. For example, the second electrode EL2 may be formed of a triple-layer structure of ITO/Ag/ITO.

A thin-film encapsulation layer TFE may be entirely provided and/or formed on the cathode electrode CE and the second electrode E2.

Since the thin-film encapsulation layer TFE has the same configuration as the thin-film encapsulation layer TFE described with reference to FIG. 5, a detailed description thereof will be omitted.

A light blocking pattern LBP may be provided/formed on the thin-film encapsulation layer TFE to correspond to the non-emission area NEMA of the first sub-pixel SPX1 and the non-emission area NEMA of the first photo-sensing pixel PSR1.

The light blocking pattern LBP may include a light blocking material that prevents light from leaking between the first sub-pixel SPX1 and a sub-pixel adjacent thereto. For example, the light blocking pattern LBP may include a black matrix, but is not limited thereto. According to an embodiment, the light blocking pattern LBP may include at least one of carbon black (CB) and titanium black (TiBK). Further, the light blocking pattern LBP may prevent color mixing of light emitted from the first sub-pixel SPX1 and each of the sub-pixels adjacent thereto.

In the first sub-pixel SPX1, the light blocking pattern LBP may be partially opened so as not to overlap the emission area EMA. The opening of the light blocking pattern LBP may provide an optical path so that the first light L1 emitted from the light-emitting element LD may be propagated to an upper portion of the display device DD. To this end, the opening of the light blocking pattern LBP may be disposed to overlap the light-emitting element LD (the emission area EMA).

In the first photo-sensing pixel PSR1, the light blocking pattern LBP may be partially opened so as not to overlap the light-receiving area FXA. The opening of the light blocking pattern LBP may provide an optical path so that the second light L2 reflected from the fingerprint of the user's finger F may be propagated to the light-receiving element OPD. To this end, the opening of the light blocking pattern LBP may be disposed to overlap the light-receiving element OPD (the light-receiving area FXA).

Color filters CF1 and CF2 may be disposed on the light blocking pattern LBP and the thin-film encapsulation layer TFE.

The color filters CF1 and CF2 may include a first color filter CF1 positioned on at least one surface of the light blocking pattern LBP and the thin-film encapsulation layer TFE of the first sub-pixel SPX1, and a second color filter CF2 positioned on at least one surface of the light blocking pattern LBP and the thin-film encapsulation layer TFE of the first photo-sensing pixel PSR. Hereinafter, the light blocking pattern LBP of the first sub-pixel SPX1 will be referred to as a first light blocking pattern, and the light blocking pattern LBP of the first photo-sensing pixel PSR will be referred to as a second light blocking pattern.

The first color filter CF1 may be disposed in the opening of the first light blocking pattern LBP to directly contact the thin-film encapsulation layer TFE exposed through the opening of the first light blocking pattern LBP. The first color filter CF1 may be disposed to overlap the light-emitting element LD (or the emission area EMA). For the sake of explanation, only the first sub-pixel SPX1 is illustrated in FIG. 7, and the first color filter CF1 may be a blue color filter. The first color filter CF1 may further include a green color filter overlapping the emission area EMA of the second sub-pixel SPX2 and a red color filter overlapping the emission area EMA of the third sub-pixel SPX3, respectively.

The second color filter CF2 may be disposed in the opening of the second light blocking pattern LBP to directly contact the thin-film encapsulation layer TFE exposed through the opening of the second light blocking pattern LBP. The second color filter CF2 may be disposed to overlap the light-receiving element OPD (or the light-receiving area FXA). The second color filter CF2 may include one of a red color filter, a green color filter, and a blue color filter according to a color light sensed by the light-receiving layer OPL. For example, when the light-receiving layer OPL absorbs light in a green wavelength band, the second color filter CF2 may be a green filter. That is, the second color filter CF2 may be set regardless of the emission colors of the adjacent sub-pixels SPX1, SPX2, and SPX3.

The above-described light blocking pattern LBP and color filters CF1 and CF2 may be used as a reflection prevention layer that blocks the reflection of external light. Since the display device DD (or the display panel DP) includes the light blocking pattern LBP used as the reflection prevention layer and the color filters CF1 and CF2, a separate polarization layer may not be provided. Thus, a reduction in luminance may be prevented and the thickness of the display device DD may be minimized.

Further, since the light-receiving element OPD is formed on the same layer as the light-emitting element LD, the thickness of the display device DD may be further reduced, and the incident amount of external light onto the light-receiving element OPD may be increased to improve photo-sensing performance. Since the sensor circuit SSC is simultaneously formed during the manufacturing process of the pixel circuit PXC and the light-receiving element OPD is simultaneously formed during the manufacturing process of the light-emitting element LD, the process time and manufacturing cost of the display device DD may be reduced.

A planarization layer OC may be further disposed between the first and second color filters CF1 and CF2 and the window WD. The planarization layer OC may serve to planarize a step caused by components disposed thereunder. The planarization layer OC may be an organic layer. The organic layer may include acryl resin, epoxy resin, phenolic resin, polyamide resin, polyimide resin, and the like, but is not limited thereto.

Figure 9:
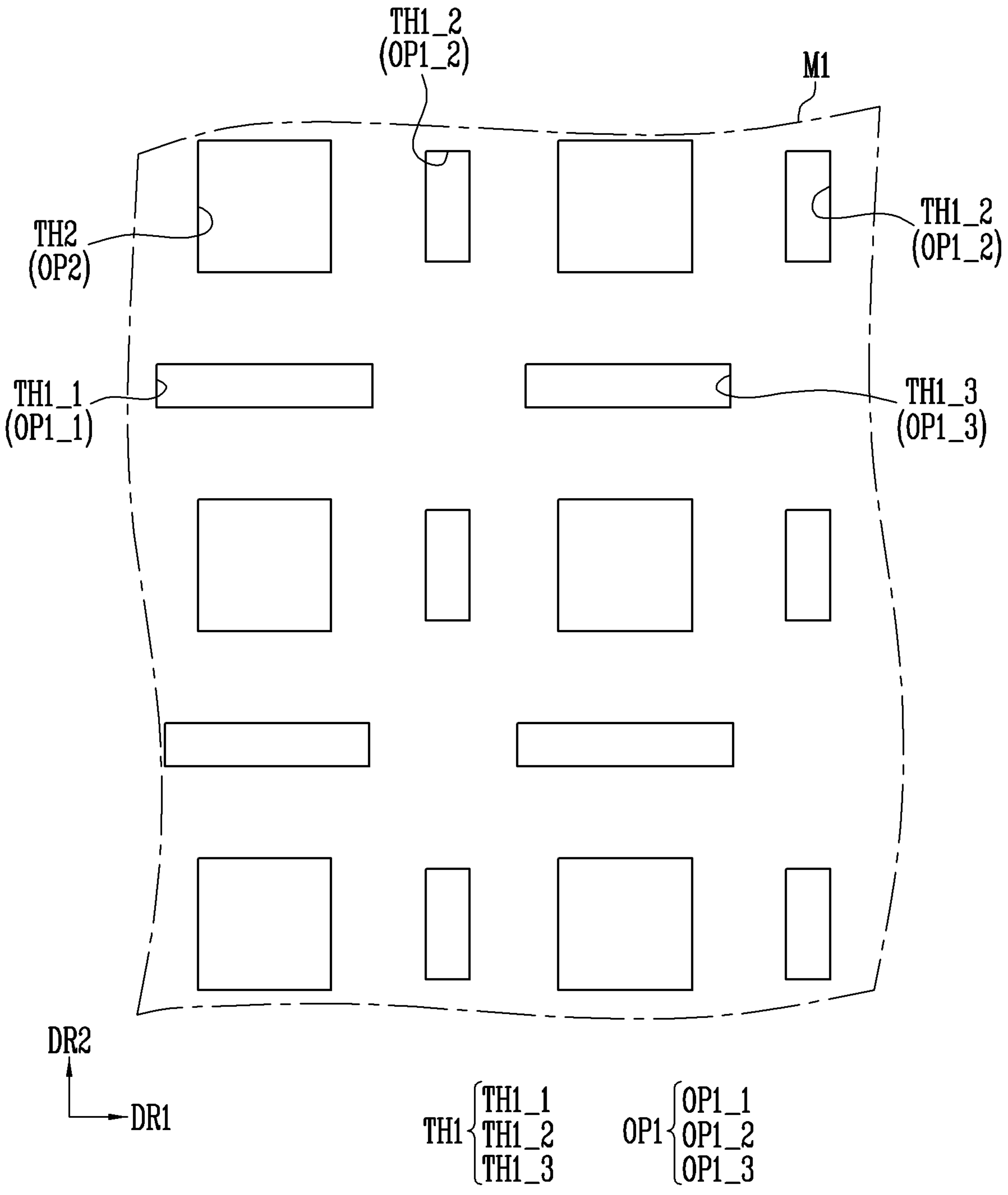
FIG. 9 is a plan view schematically illustrating a first mask for forming a pixel defining layer provided in sub-pixels and a photo-sensing pixel in accordance with an embodiment.

FIG. 9 is a plan view schematically illustrating a first mask M1 for forming a pixel defining layer provided in sub-pixels and a photo-sensing pixel in accordance with an embodiment.

Referring to FIGS. 6 and 9, the first mask M1 according to the embodiment may include a first through hole TH1 and a second through hole TH2. The first mask M1 may be a fine metal mask (FMM) that is used when depositing the pixel defining layer (Cf. "PDL" in FIG. 5). The first mask M1 may be manufactured by forming a through hole (or a hole) in a metal plate and then stretching it.

The first and second through holes TH1 and TH2 may be disposed to be spaced apart from each other. Each of the first and second through holes TH1 and TH2 may be provided in plural.

The first through hole TH1 may include a 1-1-th through hole TH1_1, a 1-2-th through hole TH1_2, and a 1-3-th through hole TH1_3 that are disposed to be spaced apart from each other.

The 1-1-th through hole TH1_1 may be provided in a rectangular shape in which a width in the first direction DR1 and a width in the second direction DR2 are different. In an embodiment, the 1-1-th through hole TH1_1 is used to form the first opening (Cf. "OP1" in FIG. 5) of the pixel defining layer PDL defining the emission area EMA of the first sub-pixel SPX1. The size of the 1-1-th through hole TH1_1 may be equal or similar to that of the first opening OP1 (hereinafter, referred to as a 1-1-th opening OP1_1). The 1-1-th opening OP1_1 may have a shape corresponding to that of the 1-1-th through hole TH1_1 of the first mask M1. In other words, the 1-1-th opening OP1_1 may be provided in a rectangular shape.

The 1-2-th through hole TH1_2 may be provided in a rectangular shape in which a width in the first direction DR1 and a width in the second direction DR2 are different. In an embodiment, the 1-2-th through hole TH1_2 is used to form the first opening OP1 of the pixel defining layer PDL defining the emission area EMA of the second sub-pixel SPX2. The size of the 1-2-th through hole TH1_2 may be equal or similar to that of the first opening OP1 (hereinafter, referred to as a 1-2-th opening OP1_2). The 1-2-th opening OP1_2 may have a shape corresponding to that of the 1-2-th through hole TH1_2 of the first mask M1. In other words, the 1-2-th opening OP1_2 may be provided in a rectangular shape. Thus, the emission area EMA of the second sub-pixel SPX2 may have the shape of a rectangular plane.

The 1-3-th through hole TH1_3 may be provided in a rectangular shape in which a width in the first direction DR1 and a width in the second direction DR2 are different. In an embodiment, the 1-3-th through hole TH1_3 is used to form the first opening OP1 of the pixel defining layer PDL defining the emission area EMA of the third sub-pixel SPX3. The size of the 1-3-th through hole TH1_3 may correspond to that of the first opening OP1 (hereinafter, referred to as a 1-3-th opening OP1_3). The 1-3-th opening OP1_3 may have a shape corresponding to that of the 1-3-th through hole TH1_3 of the first mask M1. In other words, the first opening OP1 may be provided in a rectangular shape. Thus, the emission area EMA of the third sub-pixel SPX3 may have the shape of a rectangular plane.

The second through hole TH2 may be provided in a square shape in which a width in the first direction DR1 is the same as a width in the second direction DR2. In an embodiment, the second through hole TH2 is used to form the second opening OP2 of the pixel defining layer PDL defining the light-receiving area FXA of the photo-sensing pixel PSR. The size of the second through hole TH2 may correspond to that of the second opening OP2. The second opening OP2 may have a shape corresponding to that of the second through hole TH2 of the first mask M1. In other words, the second opening OP2 may be provided in a square shape. Thus, the light-receiving area FXA of the photo-sensing pixel PSR may have the shape of a square plane.

Figure 10:
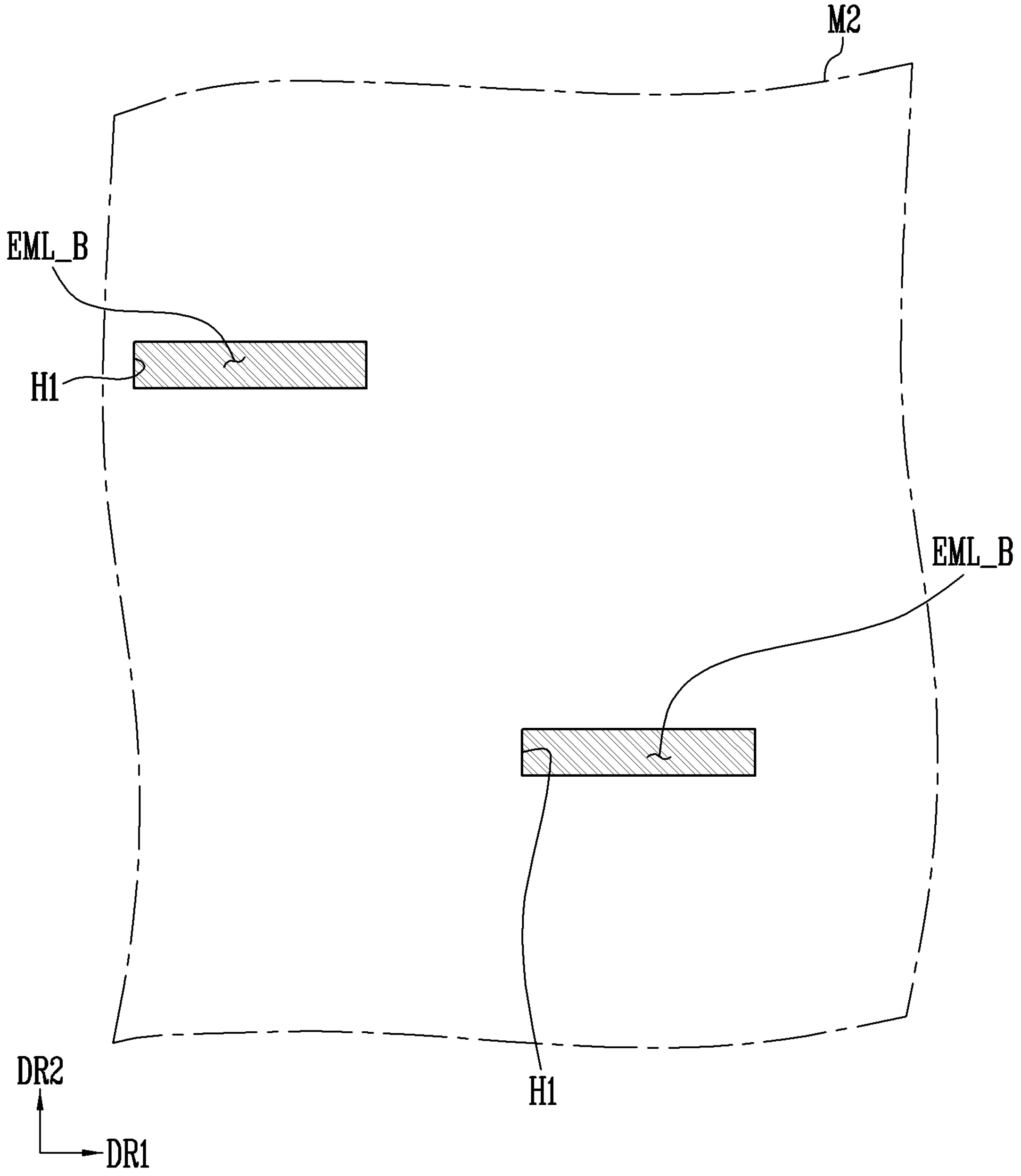
FIG. 10 is a plan view schematically illustrating a second mask forming a light-emitting layer of a first sub-pixel among sub-pixels in accordance with an embodiment.

FIG. 10 is a plan view schematically illustrating a second mask M2 forming an emission layer EML_B of a first sub-pixel among sub-pixels in accordance with an embodiment.

Referring to FIGS. 6, 9, and 10, the second mask M2 in accordance with an embodiment may include a plurality of first holes H1. The second mask M2 may be a fine metal mask (FMM) that is used when forming the emission layer EML_B on the anode electrode (Cf. "AE" in FIG. 5) exposed by the 1-1-th opening OP1_1 of the pixel defining layer PDL. The emission layer EML_B may be an organic light-emitting layer of the first sub-pixel SPX1.

The first holes H1 may be disposed to be spaced apart from each other.

Each of the first holes H1 may be provided in a rectangular shape in which a width in the first direction DR1 and a width in the second direction DR2 are different. In an embodiment, each first hole H1 is used to form the emission layer EML_B in the 1-1-th opening OP1_1 of the pixel defining layer PDL. The size of the first hole may be equal or similar to that of the 1-1-th opening OP1_1.

The material (or organic material) that has passed through each of the first holes H1 of the second mask M2 may be applied in the 1-1-th opening OP1_1 of the pixel defining layer PDL to form the emission layer EML_B of the first sub-pixel SPX1. The emission layer EML_B may have a planar shape corresponding to each of the first holes H1 and the 1-1-th opening OP1_1. The emission layer EML_B of the first sub-pixel SPX1 may have the shape of a rectangular plane to determine the sectional area (or size) of the emission area EMA of the first sub-pixel SPX1 defined by the emission layer EML_B.

Figure 11:
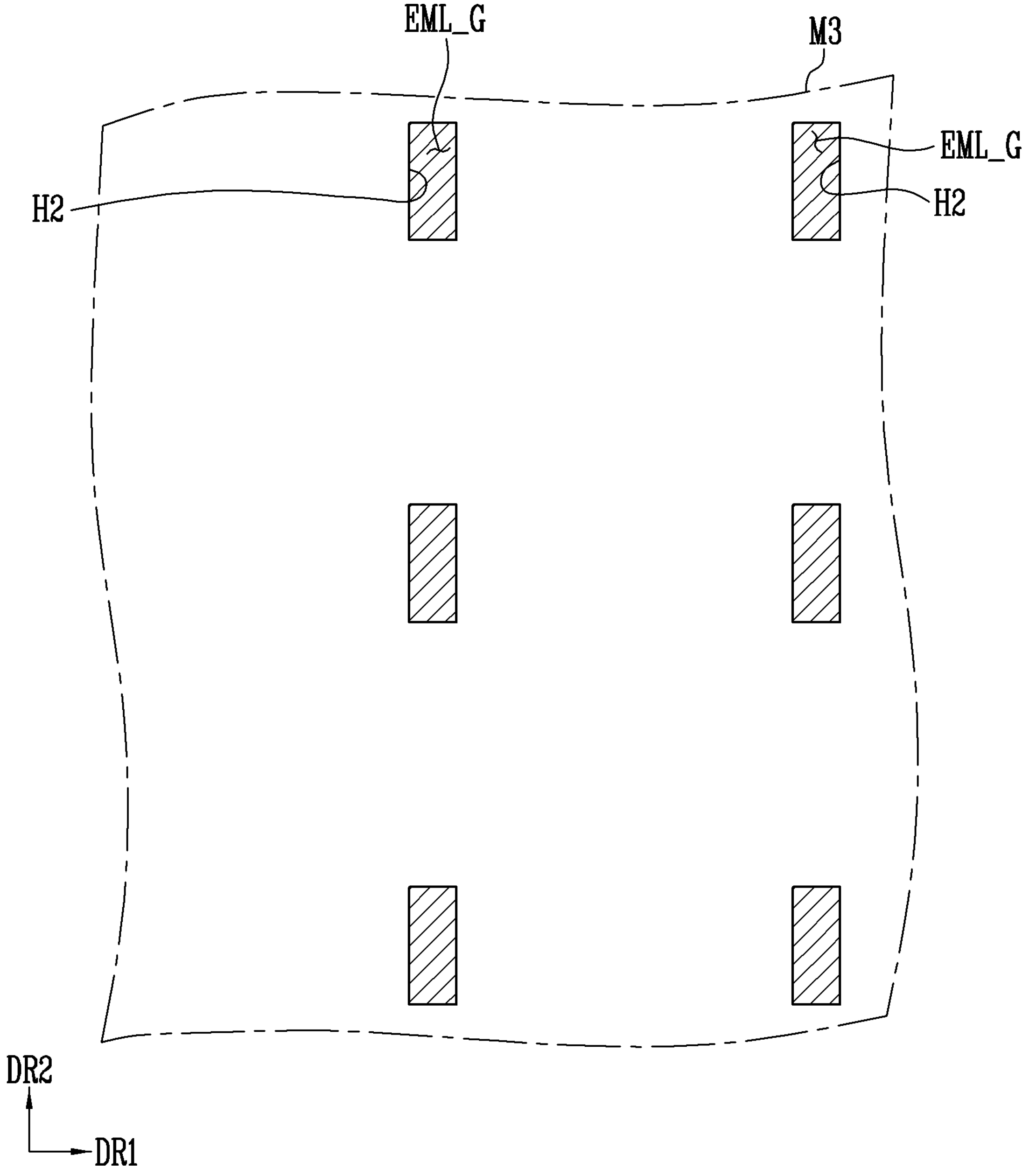
FIG. 11 is a plan view schematically illustrating a third mask forming a light-emitting layer of a second sub-pixel among the sub-pixels in accordance with an embodiment.

FIG. 11 is a plan view schematically illustrating a third mask M3 forming an emission layer EML_G of a second sub-pixel among the sub-pixels in accordance with an embodiment.

Referring to FIGS. 6, 9, and 11, the third mask M3 in accordance with an embodiment may include a plurality of second holes H2. The third mask M3 may be a fine metal mask (FMM) that is used when forming the emission layer EML_G on the anode electrode (Cf. "AE" in FIG. 5) exposed by the 1-2-th opening OP1_2 of the pixel defining layer PDL. The emission layer EML_G may be an organic light-emitting layer of the second sub-pixel SPX2.

The second holes H2 may be disposed to be spaced apart from each other. In an embodiment, the second holes H2 may be designed to have sizes different from those of the first holes H1 of the second mask M2.

Each of the second holes H2 may be provided in a rectangular shape in which a width in the first direction DR1 and a width in the second direction DR2 are different. In an embodiment, each second hole H2 is used to form the emission layer EML_G in the 1-2-th opening OP1_2 of the pixel defining layer PDL. The size of the second hole may be equal or similar to that of the 1-2-th opening OP1_2.

The material (or organic material) that has passed through each of the second holes H2 of the third mask M3 may be applied in the 1-2-th opening OP1_2 of the pixel defining layer PDL to form the emission layer EML_G of the second sub-pixel SPX2. The emission layer EML_G may have a planar shape corresponding to each of the second holes H2 and the 1-2-th opening OP1_2. The emission layer EML_G of the second sub-pixel SPX2 may have the shape of a rectangular plane to determine the sectional area (or size) of the emission area EMA of the second sub-pixel SPX2 defined by the emission layer EML_G.

Figure 12:
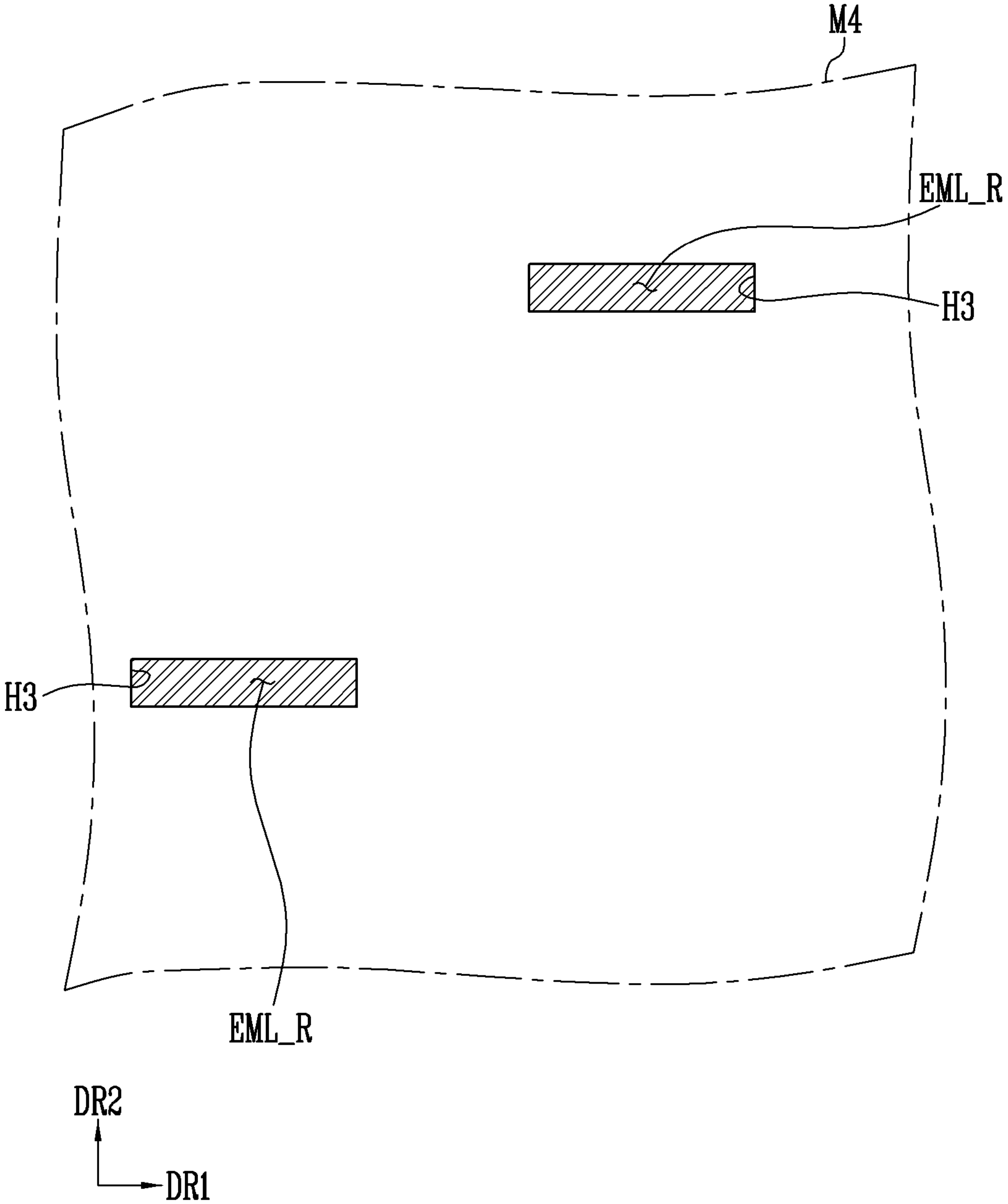
FIG. 12 is a plan view schematically illustrating a fourth mask forming a light-emitting layer of a third sub-pixel among the sub-pixels in accordance with an embodiment.

FIG. 12 is a plan view schematically illustrating a fourth mask M4 forming an emission layer EML_R of a third sub-pixel among the sub-pixels in accordance with an embodiment.

Referring to FIGS. 6, 9, and 12, the fourth mask M4 may include a plurality of third holes H3. The fourth mask M4 may be a fine metal mask (FMM) that is used when forming the emission layer EML_R on the anode electrode (Cf. "AE" in FIG. 5) exposed by the 1-3-th opening OP1_3 of the pixel defining layer PDL. The emission layer EML_R may be an organic light-emitting layer of the third sub-pixel SPX3.

The third holes H3 may be disposed to be spaced apart from each other. In an embodiment, the third holes H3 may be designed to have sizes different from those of the first holes H1 of the second mask M2 and the second holes H2 of the third mask M3. However, the embodiment described herein is not limited thereto.

Each of the third holes H3 may be provided in a rectangular shape in which a width in the first direction DR1 and a width in the second direction DR2 are different. In an embodiment, each third hole H3 is used to form the emission layer EML_R in the 1-3-th opening OP1_3 of the pixel defining layer PDL. The size of the third hole may be equal or similar to that of the 1-3-th opening OP1_3.

The material (or organic material) that has passed through each of the third holes H3 of the fourth mask M4 may be applied in the 1-3-th opening OP1_3 of the pixel defining layer PDL to form the emission layer EML_R of the third sub-pixel SPX3. The emission layer EML_R may have a planar shape corresponding to each of the third holes H3 and the 1-3-th opening OP1_3. The emission layer EML_R of the third sub-pixel SPX3 may have the shape of a rectangular plane to determine the sectional area (or size) of the emission area EMA of the third sub-pixel SPX3 defined by the emission layer EML_R.

Figure 13:
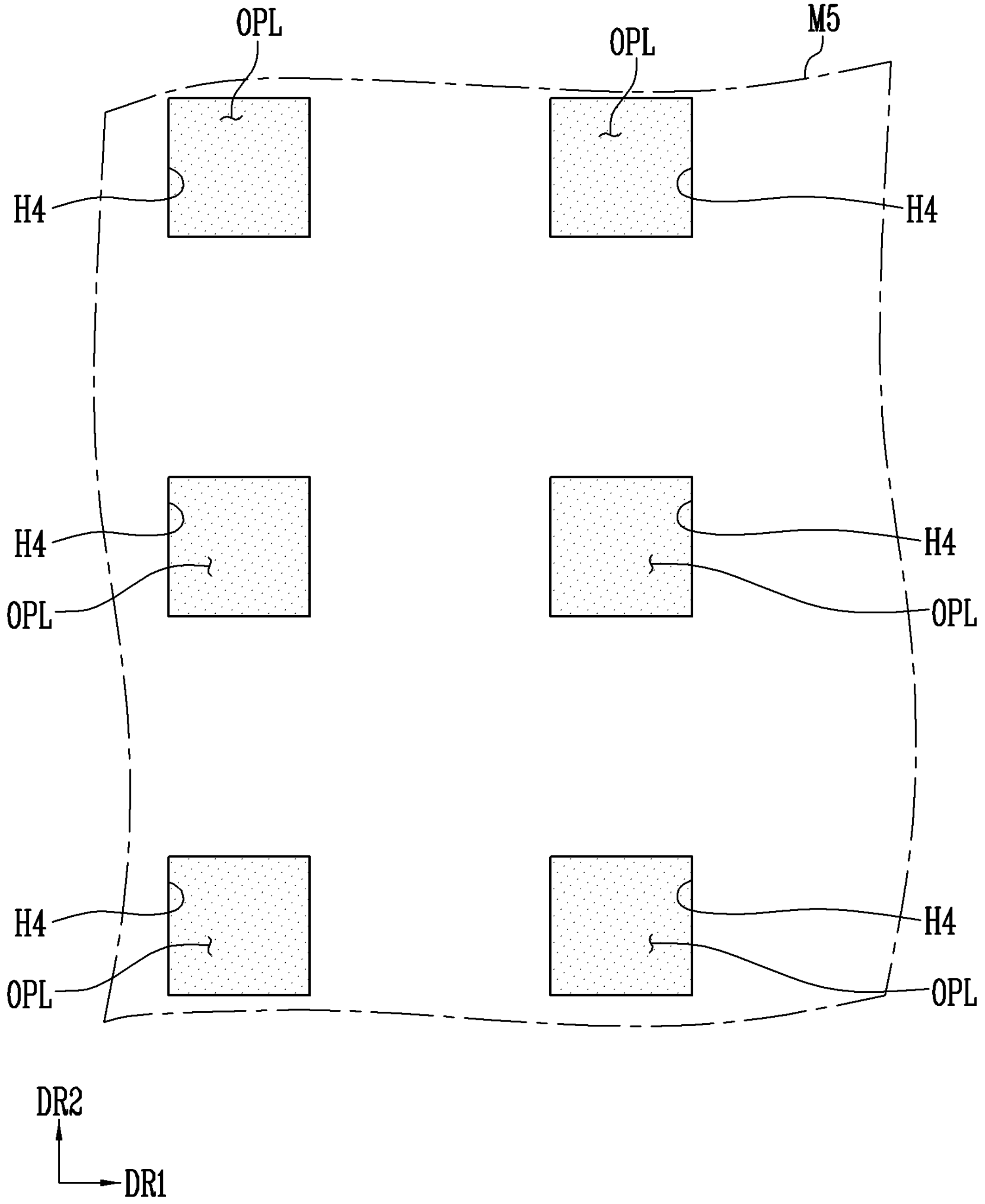
FIG. 13 is a plan view schematically illustrating a fifth mask forming a light-receiving layer of a photo-sensing pixel according to an embodiment.

FIG. 13 is a plan view schematically illustrating a fifth mask M5 forming a light-receiving layer OPL of a photo-sensing pixel according to an embodiment.

Referring to FIGS. 6, 9, and 13, the fifth mask M5 may include a plurality of fourth holes H4. The fifth mask M5 may be a fine metal mask (FMM) that is used when forming the light-receiving layer OPL on the first electrode (Cf. "μl" in FIG. 5) exposed by the second opening OP2 of the pixel defining layer PDL. The light-receiving layer OPL may be of an organic photosensitive material of the photo-sensing pixel PSR.

The fourth holes H4 may be disposed to be spaced apart from each other. In an embodiment, the fourth holes H4 may be designed to have sizes different from those of the first holes H1 of the second mask M2, the second holes H2 of the third mask M3, and the third holes H3 of the fourth mask M4.

Each of the fourth holes H4 may be provided in a square shape in which a width in the first direction DR1 is the same as a width in the second direction DR2. In an embodiment, each fourth hole H4 is used to form the light-receiving layer OPL in the second opening OP2 of the pixel defining layer PDL. The size of the fourth hole may be equal or similar to that of the second opening OP2.

The material (or organic material) that has passed through each of the fourth holes H4 of the fifth mask M5 may be applied in the second opening OP2 of the pixel defining layer PDL to form the light-receiving layer OPL of the photo-sensing pixel PSR. The light-receiving layer OPL may have a planar shape corresponding to each of the fourth holes H4 and the second opening OP2. The light-receiving layer OPL of the photo-sensing pixel PSR may have the shape of a square plane to determine the sectional area (or size) of the light-receiving area FXA of the photo-sensing pixel PSR defined by the light-receiving layer OPL.

Figure 14:
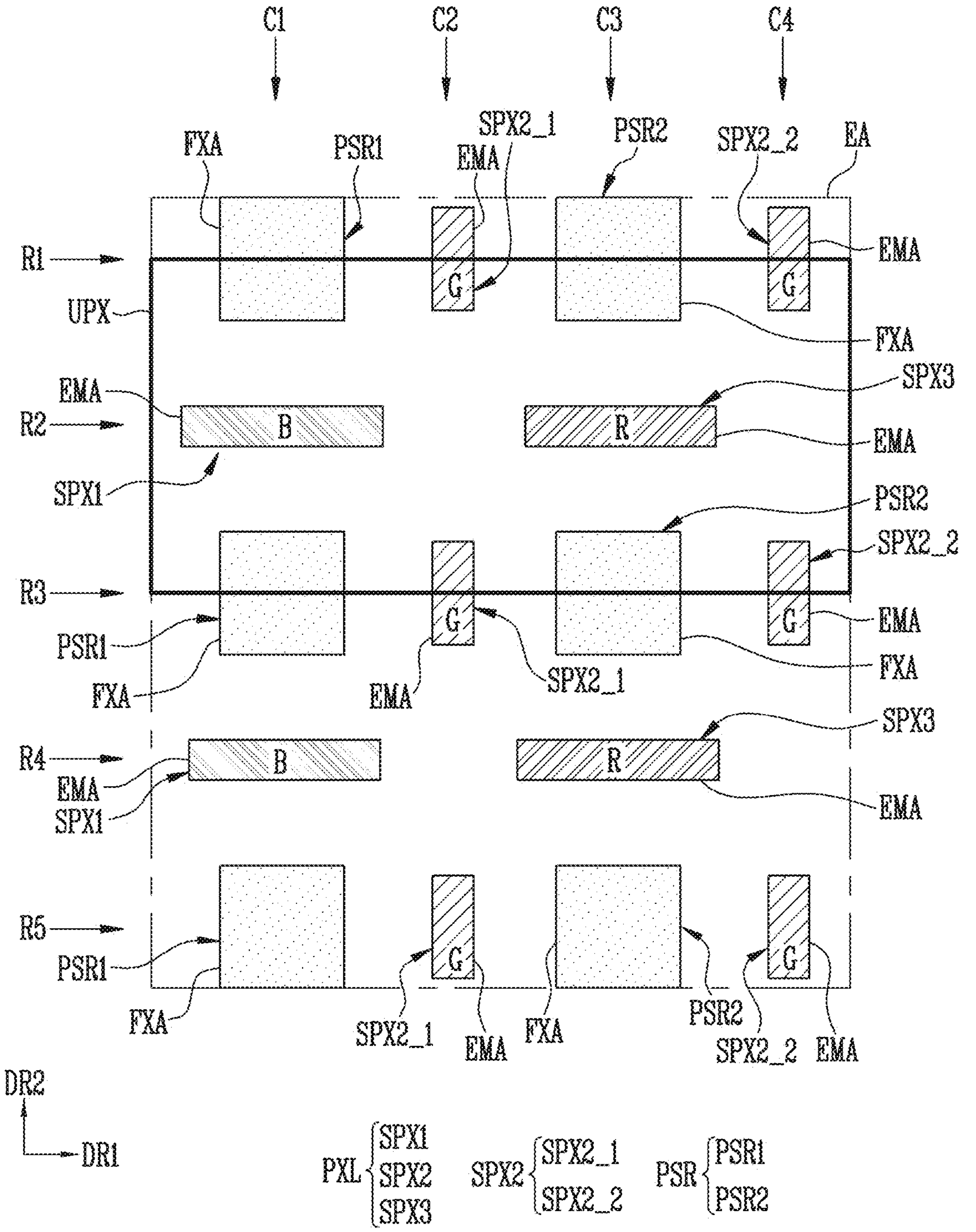
FIGS. 14 and 15 are schematic enlarged views corresponding to portion EA of FIG. 2 to illustrate a unit pixel in accordance with an embodiment.
Figure 15:
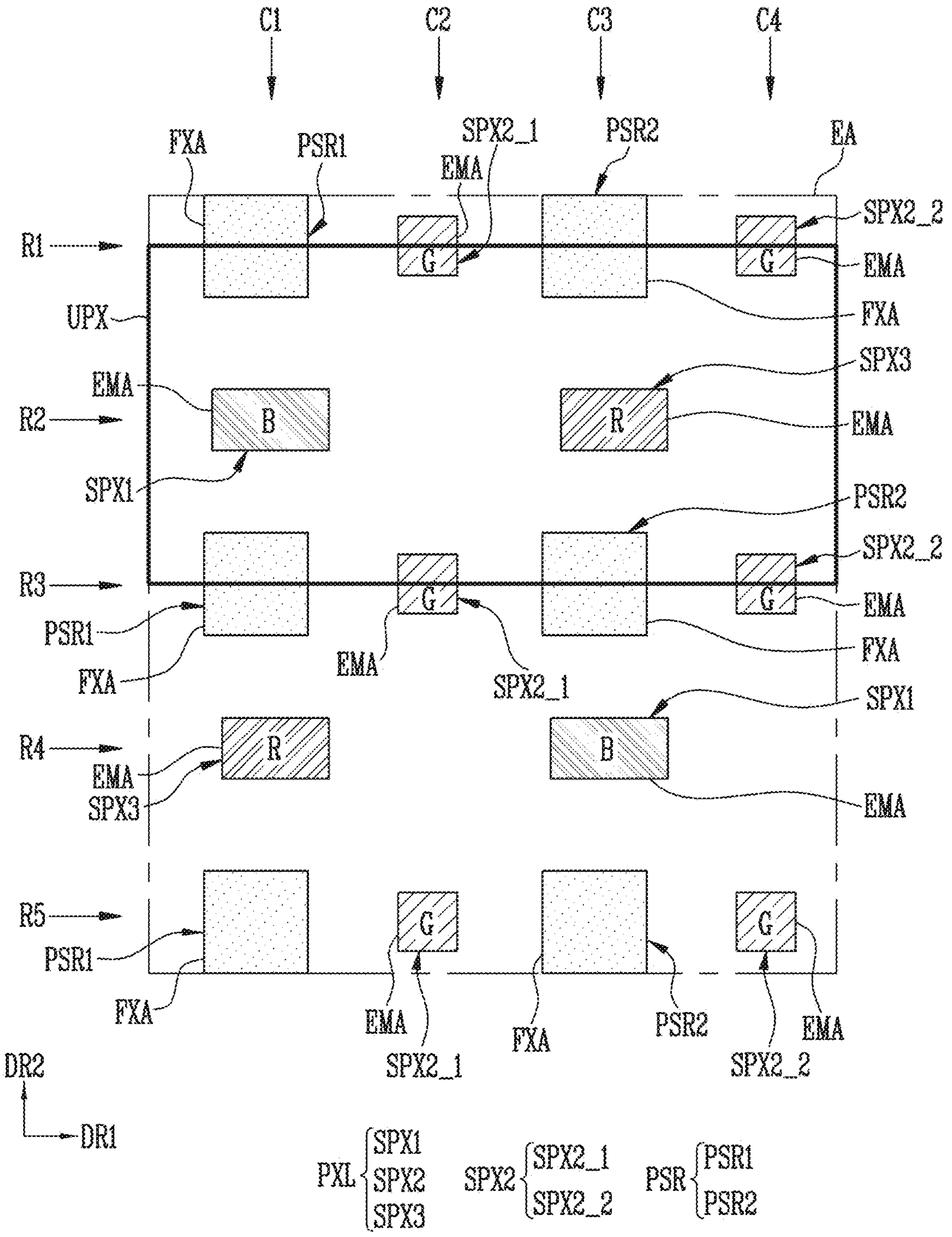

FIGS. 14 and 15 are schematic enlarged views corresponding to portion EA of FIG. 2 to illustrate a unit pixel in accordance with an embodiment.

In FIGS. 14 and 15, differences from the above-described embodiment will be mainly described for ease in explanation of the embodiment. In FIGS. 14 and 15, parts that are not specifically described comply with the above-described embodiment, like reference numerals denote like components, and similar reference numerals denote similar components.

FIG. 14 shows a modification of FIG. 6 in relation to the arrangement of the first and third sub-pixels SPX1 and SPX3.

FIG. 15 shows a modification of FIG. 6 in relation to the shape of the second sub-pixel SPX2.

First, referring to FIGS. 2 and 14, the first photo-sensing pixel PSR1 and the first sub-pixel SPX1 may be alternately disposed in the second direction DR2 to form a first column C1. On the first column C1, the first photo-sensing pixel PSR1 receiving light, the first sub-pixel SPX1 emitting blue light B, the first photo-sensing pixel PSR1 receiving light, the first sub-pixel SPX1 emitting blue light B, and the first photo-sensing pixel PSR1 receiving light may be arranged in this order.

In an embodiment, the second photo-sensing pixel PSR2 and the third sub-pixel SPX3 may be alternately arranged in the second direction DR2 to form a third column C3. On the third column C3, the second photo-sensing pixel PSR2 receiving light, the third sub-pixel SPX3 emitting red light R, the second photo-sensing pixel PSR2 receiving light, the third sub-pixel SPX3 emitting red light R, and the second photo-sensing pixel PSR2 receiving light may be arranged in this order.

The second sub-pixels SPX2 may be disposed in each of second and fourth columns C2 and C4 to alternate with the first sub-pixels SPX1 positioned in the first column C1 and the third sub-pixels SPX3 positioned in the third column C3. The second sub-pixels SPX2 may include 2-1-th sub-pixels SPX2_1 that are positioned in the second column C2 and are positioned in the same row as the first photo-sensing pixel PSR1, and 2-2-th sub-pixels SPX2_2 that are positioned in the fourth column C4 and are positioned in the same row as the second photo-sensing pixel PSR2.

In an embodiment, each of the first to third sub-pixels SPX1 to SPX3 may include an emission area EMA having the shape of a rectangular plane in which a width (or a horizontal width) in the first direction DR1 and a width (or a vertical width) in the second direction DR2 are different. Further, each of the first and second photo-sensing pixels PSR1 and PSR2 may include a light-receiving area FXA having the shape of a square plane in which a width (or a horizontal width) in the first direction DR1 is the same as a width (or a vertical width) in the second direction DR2.

Next, referring to FIGS. 2 and 15, the second sub-pixels SPX2 positioned in each of the second and fourth columns C2 and C4 may include an emission area EMA having the shape of a square plane in which a width (or a horizontal width) in the first direction DR1 is the same as a width (or a vertical width) in the second direction DR2. Here, the emission area EMA of each of the second sub-pixels SPX2 may have a size (or sectional area) smaller than the light-receiving area FXA of each of the first and second photo-sensing pixels PSR1 and PSR2. However, without being limited thereto, the sectional area of each of the first and second photo-sensing pixels PSR1 and PSR2 and the sectional area of each of the second sub-pixels SPX2 may be variously changed within a range in which image quality may be guaranteed, without significantly affecting the light emission of the unit pixel UPX. The first sub-pixels SPX1 may include the emission area EMA having the shape of a rectangular plane in which a width (or a horizontal width) in the first direction DR1 and a width (or a vertical width) in the second direction DR2 are different from each other, and the third sub-pixels SPX3 may have the shape of a rectangular plane in which a width (or a horizontal width) in the first direction DR1 and a width (or a vertical width) in the second direction DR2 are different from each other.

Figure 16:
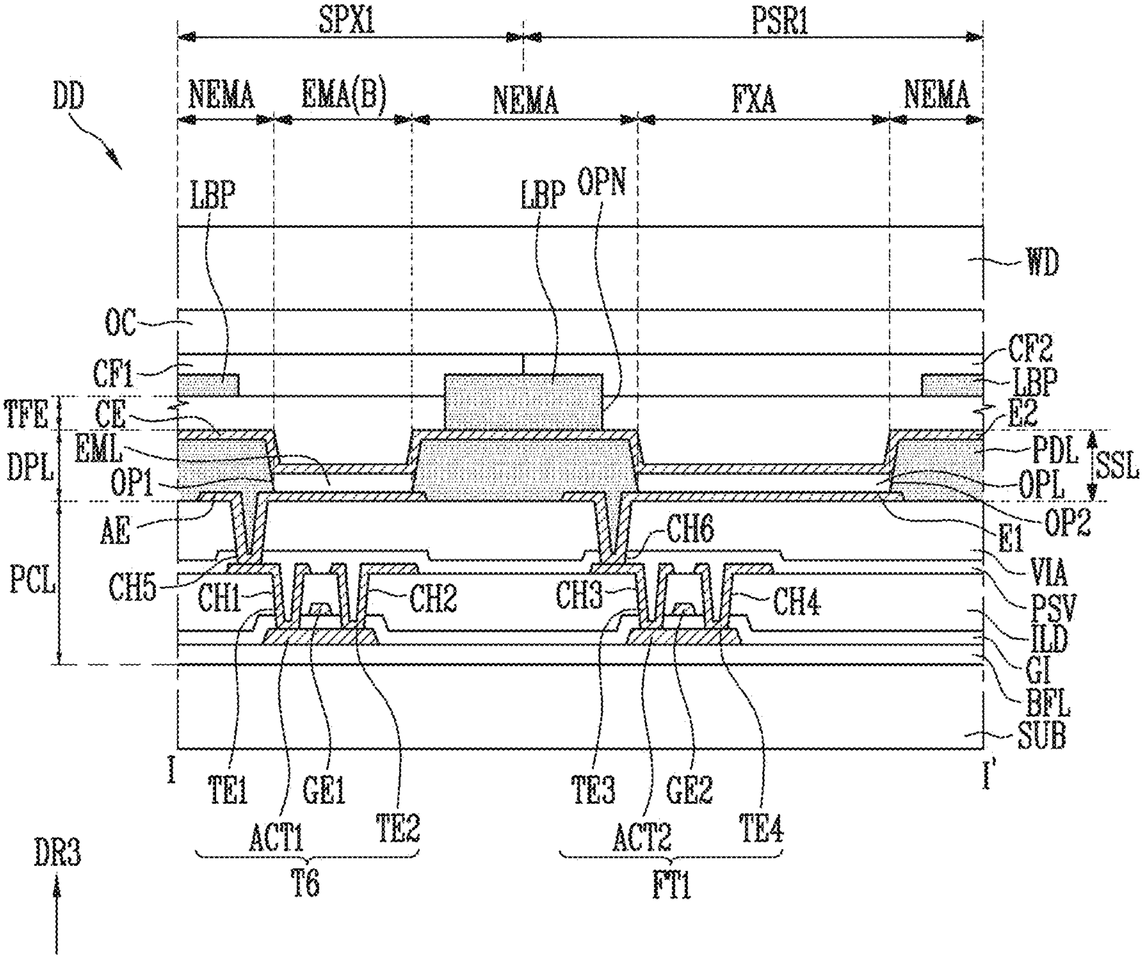
FIGS. 16 to 18 are cross-sectional views schematically illustrating a display device in accordance with an embodiment.
Figure 17:
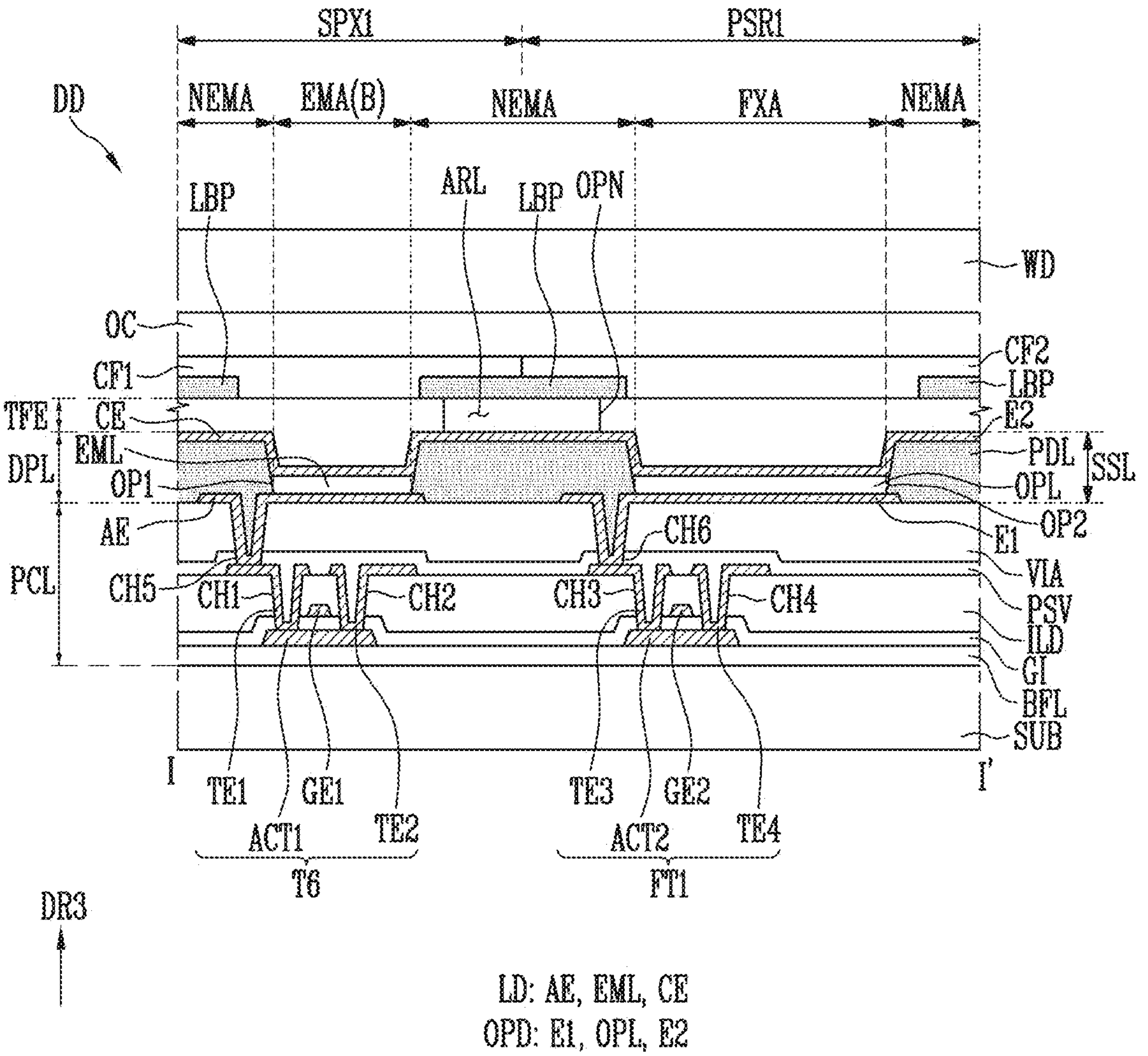
Figure 18:
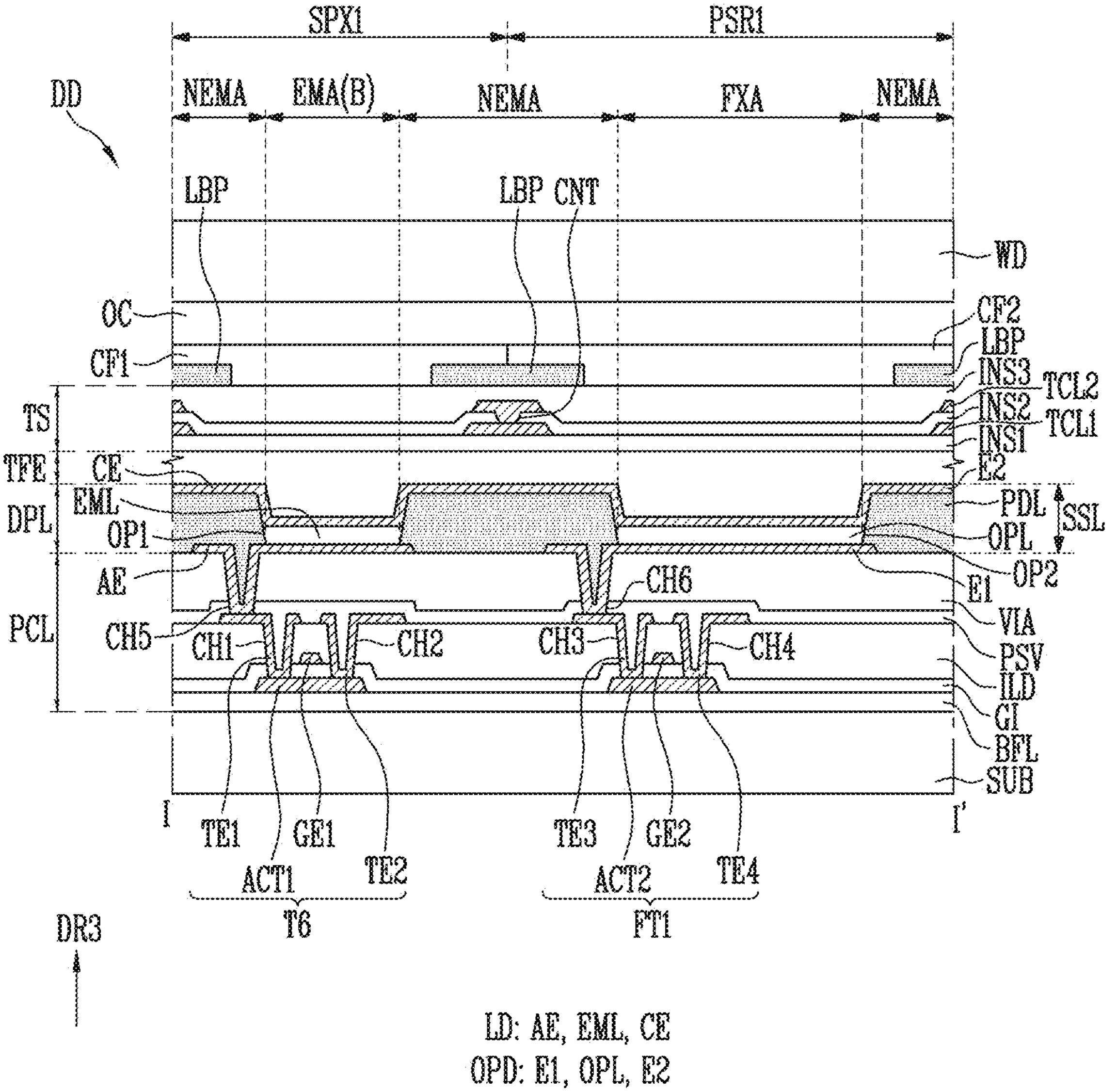

FIGS. 16 to 18 are cross-sectional views schematically illustrating a display device DD in accordance with an embodiment.

In FIGS. 16 to 18, differences from the above-described embodiment will be mainly described for ease in explanation of the embodiment. In FIGS. 16 to 18, parts that are not specifically described comply with the above-described embodiment, like reference numerals denote like components, and similar reference numerals denote similar components.

FIGS. 16 and 17 illustrate modifications of FIG. 7 in relation to the thin-film encapsulation layer TFE or the like.

FIG. 18 illustrates a modification of FIG. 7 in relation to an additional component (touch sensor TS).

First, referring to FIG. 16, the thin-film encapsulation layer TFE may be partially opened to include an opening OPN exposing the cathode electrode CE of the first sub-pixel SPX1 and the second electrode E2 of the first photo-sensing pixel PSR1.

The light blocking pattern LBP may be disposed to fill the opening OPN and protrude from the upper surface of the thin-film encapsulation layer TFE in the third direction DR3. The light blocking pattern LBP may be provided in the opening OPN of the thin-film encapsulation layer TFE to correspond to the non-emission area NEMA positioned between the emission area EMA of the first sub-pixel SPX1 and the light-receiving area FXA of the first photo-sensing pixel PSR1.

The light blocking pattern LBP may prevent blue light B emitted from the light-emitting element LD (the emission layer EML) of the first sub-pixel SPX1 from being directly propagated to the light-receiving element OPD of the first photo-sensing pixel PSR1.

In some embodiments, an air layer ARL may be formed in the opening OPN of the thin-film encapsulation layer TFE as shown in FIG. 17, in place of the light blocking pattern LBP. The air layer ARL may prevent blue light B emitted from the light-emitting element LD (the emission layer EML) of the first sub-pixel SPX1 from being directly propagated to the light-receiving element OPD of the first photo-sensing pixel PSR1, due to a difference in refractive index between the air layer ARL and the thin-film encapsulation layer TFE. The light blocking pattern LBP may be disposed to cover the air layer ARL.

Next, referring to FIG. 18, the touch sensor TS may be disposed on the thin-film encapsulation layer TFE.

The touch sensor TS may include a first insulating layer INS1, a second insulating layer INS2, a third insulating layer INS3, and first and second touch conductive layers TCL1 and TCL2. Each of the above-described layers may be configured as a single layer. However, without being limited thereto, each layer may be configured as a stacked layer including a plurality of layers according to an embodiment. Another layer may be further disposed between the respective layers.

The first insulating layer INS1 may include an inorganic insulating layer including inorganic material or an organic insulating layer including organic material. The inorganic insulating layer may include an inorganic insulating material such as silicon oxide ($SiO_x$), silicon nitride ($SiN_x$), silicon oxynitride ($SiO_xN_y$), aluminum oxide ($Al_xO_y$), titanium oxide ($TiO_x$), tantalum oxide ($Ta_xO_y$), hafnium oxide ($HfO_x$), or zinc oxide ($ZnO_x$). The zinc oxide ($ZnO_x$) may be zinc oxide (ZnO) and/or zinc peroxide ($ZnO_2$). The organic insulating layer may include at least one of acrylic resin, methacrylic resin, polyisoprene, vinyl-based resin, epoxy-based resin, urethane-based resin, cellulose-based resin, siloxane-based resin, polyimide-based resin, polyamide-based resin, and perylene-based resin.

The first insulating layer INS1 may be omitted or formed as an uppermost layer of the thin-film encapsulation layer TFE according to an embodiment.

The first touch conductive layer TCL1 may be provided and/or formed on the first insulating layer INS1. The first touch conductive layer TCL1 may have a single-layer structure or a multi-layer structure stacked in a thickness direction (e.g. the third direction DR3). The touch conductive layer having the single-layer structure may include a metal layer or a transparent conductive layer. The metal layer may include molybdenum, silver, titanium, copper, aluminum, and an alloy thereof. The transparent conductive layer may include transparent conductive oxide such as indium tin oxide (ITO), indium zinc oxide (IZO), zinc oxide ($ZnO_x$), or indium tin zinc oxide (ITZO). In addition, the transparent conductive layer may include PEDOT, metal nanowires, or graphene. The first touch conductive layer TCL1 may form a first layer of a plurality of touch electrodes.

The first touch conductive layer TCL1 may be disposed on a surface of the first insulating layer INS1 to overlap the pixel defining layer PDL and thereby prevent the opening ratios of the first sub-pixel SPX1 and the first photo-sensing pixel PSR1 from being reduced. In other words, the first touch conductive layer TCL1 may be disposed on a surface of the first insulating layer INS1 while avoiding the emission area EMA of the first sub-pixel SPX1 and the light-receiving area FXA of the first photo-sensing pixel PSR1 so as to secure image quality and a light receiving amount.

The second insulating layer INS2 may be entirely provided and/or formed on the first touch conductive layer TCL1 and the first insulating layer INS1. The second insulating layer INS2 may be positioned between the first touch conductive layer TCL1 and the second touch conductive layer TCL2 to electrically insulate the first touch conductive layer TCL1 from the second touch conductive layer TCL2. The second insulating layer INS2 may include the same material as the first insulating layer INS1, or include one or more materials selected from materials forming the first insulating layer INS1. For example, the second insulating layer INS2 may include an inorganic layer, but the embodiment described herein is not limited thereto.

The second insulating layer INS2 may be partially opened to include a contactor CNT exposing an area of the first touch conductive layer TCL1.

The second touch conductive layer TCL2 may be provided and/or formed on the second insulating layer INS2. The second touch conductive layer TCL2 may include the same material as the first touch conductive layer TCL1, or include one or more materials selected from materials forming the first touch conductive layer TCL1. The second touch conductive layer TCL2 may form a second layer of the plurality of touch electrodes. The second touch conductive layer TCL2 may be electrically connected to the first touch conductive layer TCL1 through the contactor CNT of the second insulating layer INS2. The second touch conductive layer TCL2 may be disposed on a surface of the second insulating layer INS2 to overlap the pixel defining layer PDL and thereby prevent the opening ratios of the first sub-pixel SPX1 and the first photo-sensing pixel PSR1 from being reduced. In other words, the second touch conductive layer TCL2 may be disposed on a surface of the second insulating layer INS2 while avoiding the emission area EMA of the first sub-pixel SPX1 and the light-receiving area FXA of the first photo-sensing pixel PSR1 so as to secure image quality and a light receiving amount.

The third insulating layer INS3 may be entirely provided and/or formed on the second touch conductive layer TCL2 and the second insulating layer INS2. The third insulating layer INS3 may include an organic layer, but the embodiment described herein is not limited thereto. According to an embodiment, the third insulating layer INS3 may be formed of an inorganic layer or may have a structure in which an organic layer and an inorganic layer are alternately stacked.

A display device according to an embodiment may display image information and detect user biometric fingerprint information by locating a sub-pixel including a light-emitting element and a photo-sensing pixel sensing light on the same substrate.

Furthermore, a display device according to an embodiment may secure the sectional area (or light-receiving sectional area) of a photo-sensing pixel according to resolution by designing an emission area of a sub-pixel and a light-receiving area of the photo-sensing pixel in a rectangular planar shape. Therefore, the display device is improved in sensing ability to sense external light, so reliability thereof may be improved.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device, comprising:

a substrate; and a plurality of unit pixels provided in the substrate, and comprising a plurality of sub-pixels each having a light-emitting element configured to emit light, and a plurality of photo-sensing pixels each having a light-receiving element that outputs a sensing signal corresponding to the light, wherein each of the plurality of sub-pixels comprises an emission area that emits the light, and each of the plurality of photo-sensing pixels comprises a light-receiving area that receives the light, wherein the emission area and the light-receiving area are provided in the substrate to be spaced apart from each other, wherein each of the emission area and the light-receiving area has a shape of a quadrangular plane, wherein the plurality of sub-pixels comprises:

a first sub-pixel configured to emit light of a first color;

a second sub-pixel configured to emit light of second color different from the first color; and a third sub-pixel configured to emit light of third color different from the first and second colors, wherein a width of the first sub-pixel along a first direction is greater than that of the second sub-pixel and that of a photo-sensing pixel of the plurality of photo-sensing pixels, and a width of the first sub-pixel along a second direction intersecting the first direction is less than that of the second sub-pixel and that of the photo-sensing pixel, and wherein the first and third sub-pixels are separated by the photo-sensing pixel along the second direction.

2. The display device according to claim 1, wherein the emission area has a shape of a rectangular plane, and the light-receiving area has a shape of a square plane.

3. The display device according to claim 1, wherein:

the emission area of each of the plurality of sub-pixels is spaced apart from the emission area of an adjacent sub-pixel, and each of a distance between the emission areas and a distance between the emission area and the light-receiving area is 16.5 μm or more.

4. The display device according to claim 1, wherein one of the plurality of unit pixels comprises:

one first sub-pixel positioned in a first column of the substrate;

a first pair of second sub-pixels positioned in a second column adjacent to the first column in the first direction;

one third sub-pixel positioned in a third column adjacent to the second column in the first direction;

a second pair of second sub-pixels positioned in a fourth column adjacent to the third column in the first direction;

two first photo-sensing pixels positioned in the first column; and two second photo-sensing pixels positioned in the third column.

5. The display device according to claim 4, wherein the first pair of second sub-pixels and the second pair of second sub-pixels emit light of an identical color.

6. The display device according to claim 5, wherein:

the first pair of second sub-pixels and the second pair of second sub-pixels emit green light, and either of the one first sub-pixel and the one third sub-pixel emits red light, and a remaining one emits blue light.

7. The display device according to claim 6, wherein the one of the plurality of unit pixels and an adjacent unit pixel of the plurality of unit pixels positioned in a same column as that of the one of the plurality of unit pixels, which extends in second direction, share the two first photo-sensing pixels or the two second photo-sensing pixels.

8. The display device according to claim 7, wherein:

in the first column, the two first photo-sensing pixels face each other with the one first sub-pixel interposed therebetween, and in the third column, the two second photo-sensing pixels face each other with the one third sub-pixel interposed therebetween.

9. The display device according to claim 8, wherein:

the one first sub-pixel and the one third sub-pixel are positioned in an identical row; and a distance between the one first sub-pixel and the one third sub-pixel in the row is different from a distance between the one first sub-pixel and one of the two first photo-sensing pixels in the first column.

10. The display device according to claim 9, wherein:

each of the one first sub-pixel, the first pair of second sub-pixels, the second pair of second sub-pixels, and the one third sub-pixel comprises an emission area having a shape of a rectangular plane, and each of the first and second photo-sensing pixels comprises a light-receiving area having a shape of a square plane.

11. The display device according to claim 9, wherein:

each of the one first sub-pixel and the one third sub-pixel comprises an emission area having a shape of a rectangular plane, each of the first pair of second sub-pixels and the second pair of second sub-pixels comprises an emission area having a shape of a square plane, and each of the first and second photo-sensing pixels comprises a light-receiving area having a shape of a square plane.

12. The display device according to claim 1, wherein:

the light-emitting element comprises an anode electrode, a emission layer positioned on the anode electrode, and a cathode electrode positioned on the emission layer, and the light-receiving element comprises a first electrode, a light-receiving layer positioned on the first electrode, and a second electrode positioned on the light-receiving layer.

13. The display device according to claim 12, wherein the cathode electrode of the light-emitting element and the second electrode of the light-receiving element are integrally provided to be electrically connected to each other.

14. The display device according to claim 12, further comprising:

a pixel defining layer positioned on the anode electrode of the light-emitting element and the first electrode of the light-receiving element, and comprising a first opening exposing a portion of the anode electrode and a second opening exposing a portion of the first electrode; and a thin-film encapsulation layer positioned on the cathode electrode of the light-emitting element and the second electrode of the light-receiving element, and covering the light-emitting element and the light-receiving element.

15. The display device according to claim 14, wherein the first opening corresponds to the emission area, and the second opening corresponds to the light-receiving area.

16. The display device according to claim 14, further comprising:

a first color filter positioned on the thin-film encapsulation layer of the emission area;

a second color filter positioned on the thin-film encapsulation layer of the light-receiving area; and a light blocking pattern positioned between the first color filter and the second color filter.

17. The display device according to claim 16, wherein:

the thin-film encapsulation layer comprises an opening configured to expose a portion of each of the cathode electrode of the light-emitting element and the second electrode of the light-receiving element between the emission area and the light-receiving area, and the light blocking pattern is provided to fill the opening in an area between the emission area and the light-receiving area.

18. The display device according to claim 16, wherein:

the thin-film encapsulation layer comprises an opening configured to expose a portion of each of the cathode electrode of the light-emitting element and the second electrode of the light-receiving element between the emission area and the light-receiving area, and an air layer is provided in the opening.

19. The display device according to claim 16, further comprising:

a touch sensor positioned between the thin-film encapsulation layer and the first and second color filters.

20. A display device, comprising:

a substrate;

a first sub-pixel comprising a pixel circuit that includes at least one transistor provided on the substrate, and a light-emitting element electrically connected to the pixel circuit;

a second sub-pixel configured to emit light of a color different from that of the first sub-pixel;

a third sub-pixel configured to emit light of third color different from the first and second colors; and a photo-sensing pixel comprising a sensor circuit that includes at least one sensor transistor provided on the substrate, and a light-receiving element electrically connected to the sensor circuit, wherein the first sub-pixel comprises an emission area configured to emit light from the light-emitting element, wherein the photo-sensing pixel comprises a light-receiving area configured to receive the light, wherein the emission area and the light-receiving area are provided in the substrate to be spaced apart from each other, wherein the emission area has a shape of a rectangular plane, and the light-receiving area has a shape of a square plane, wherein a width of the first sub-pixel along a first direction is greater than that of the second sub-pixel and that of the photo-sensing pixel, and a width of the first sub-pixel along a second direction intersecting the first direction is less than that of the second sub-pixel and that of the photo-sensing pixel, and wherein the first and third sub-pixels are separated by the photo-sensing pixel along the second direction.

* * * * *